(12) United States Patent
Ogasawara et al.

(10) Patent No.: US 7,859,973 B2
(45) Date of Patent: Dec. 28, 2010

(54) METHOD FOR RECORDING AND REPRODUCING A HOLOGRAM AND APPARATUS THEREFOR

(75) Inventors: Masakazu Ogasawara, Tsurugashima (JP); Makoto Sato, Tsurugashima (JP)

(73) Assignee: Pioneer Corporation, Tokyo (JP)

( * ) Notice: Subject to any disclaimer, the term of this patent is extended or adjusted under 35 U.S.C. 154(b) by 701 days.

(21) Appl. No.: 11/886,078

(22) PCT Filed: Mar. 13, 2006

(86) PCT No.: PCT/JP2006/305466

§ 371 (c)(1), (2), (4) Date: Nov. 26, 2007

(87) PCT Pub. No.: WO2006/098455

PCT Pub. Date: Sep. 21, 2006

(65) Prior Publication Data

US 2008/0279061 A1 Nov. 13, 2008

(30) Foreign Application Priority Data

Mar. 15, 2005 (JP) .............................. 2005-073098

(51) Int. Cl.
*G11B 7/00* (2006.01)
(52) U.S. Cl. .................. 369/103; 369/112.24
(58) Field of Classification Search ........................ None
See application file for complete search history.

(56) References Cited

U.S. PATENT DOCUMENTS

2002/0015376 A1* 2/2002 Liu et al. .................... 369/103

FOREIGN PATENT DOCUMENTS

| JP | 11-311938 | 11/1999 |
|----|-----------|---------|
| JP | 2002-123948 | 4/2002 |
| JP | 2005-122867 | 5/2005 |
| JP | 2004-134721 | 4/2007 |
| JP | 2004-286883 | 10/2007 |
| WO | 02/05270 | 1/2002 |

* cited by examiner

*Primary Examiner*—Paul Huber
(74) *Attorney, Agent, or Firm*—Drinker Biddle & Reath LLP

(57) ABSTRACT

A hologram recording method is a method of recording a hologram, on a hologram recording apparatus that records information by forming a diffraction grating through oppositely irradiating the signal beam and the reference beam to the hologram record carrier. The hologram recording method includes a step of focusing the reference beam at a first numerical aperture from a first effective diameter by means of the reference-beam objective lens, a step of separating the reference beam in a part on the optical axis and a neighborhood thereof to thereby produce from the reference beam a recording reference beam to passes through the hologram record carrier at a second numerical aperture smaller than the first numerical aperture from a second effective diameter smaller than the first effective diameter by means of the reference-beam objective lens of the reference-beam optical system, and allowing the recording reference beam to exit coaxially to the reference beam, and a step of not allowing only the recording reference beam to exit toward the hologram record carrier by means of the signal-beam optical system.

40 Claims, 17 Drawing Sheets

HOLOGRAM RECORD A: REFLECTING REFERENCE BEAM AND REFLECTING SIGNAL BEAM
HOLOGRAM RECORD B: INCIDENT REFERENCE BEAM AND REFLECTING SIGNAL BEAM
HOLOGRAM RECORD C: REFLECTING REFERENCE BEAM AND INCIDENT SIGNAL BEAM
HOLOGRAM RECORD D: INCIDENT REFERENCE BEAM AND INCIDENT SIGNAL BEAM

⟷ P-POLARIZED BEAM

⊙ S-POLARIZED BEAM

HOLOGRAM RECORD A: INCIDENT REFERENCE BEAM AND REFLECTING SIGNAL BEAM

NOT IN MODULATING

↔ P-POLARIZED BEAM

⊙ S-POLARIZED BEAM

FIG. 14  IN MODULATING (RECORDING)
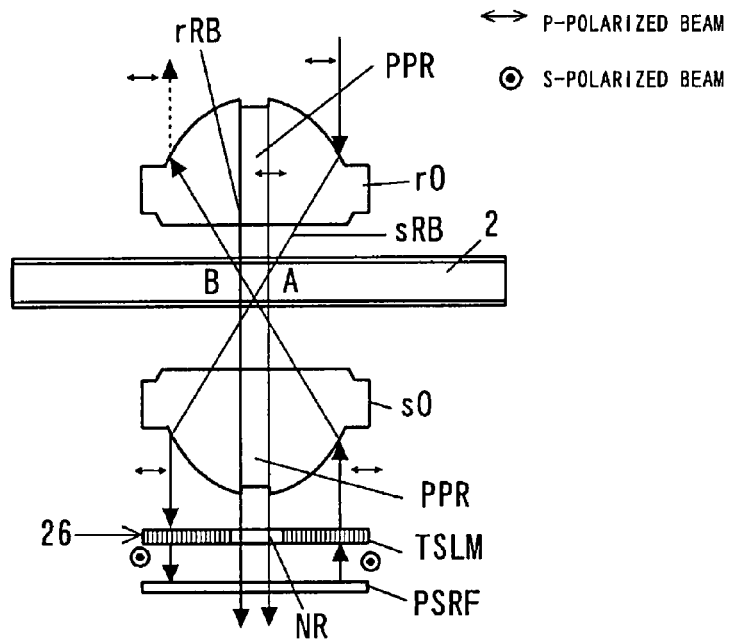
FIG. 15  IN REPRODUCING
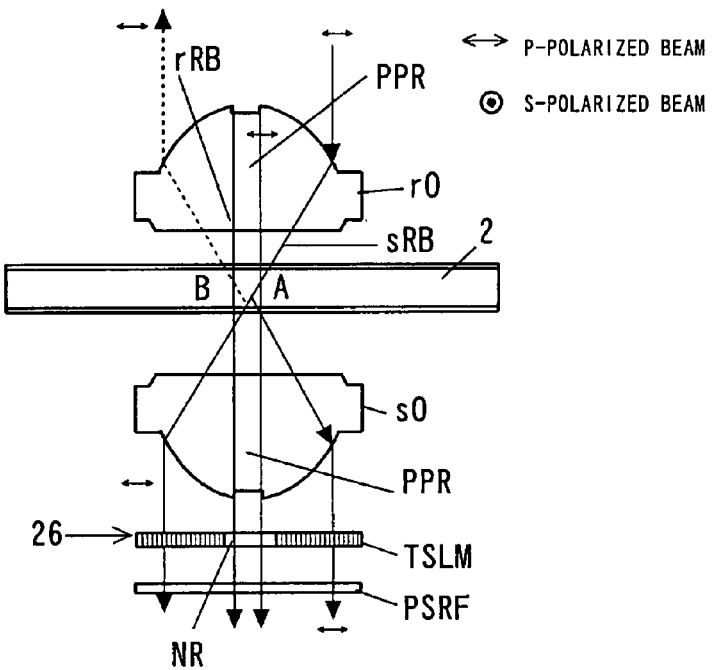

FIG. 16   NOT IN MODULATING
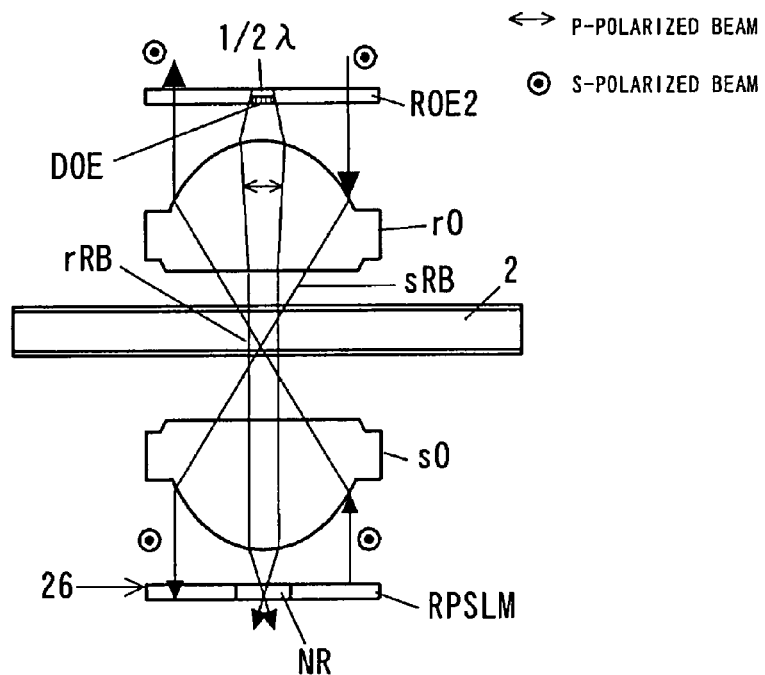
FIG. 17
IN MODULATING (RECORDING)
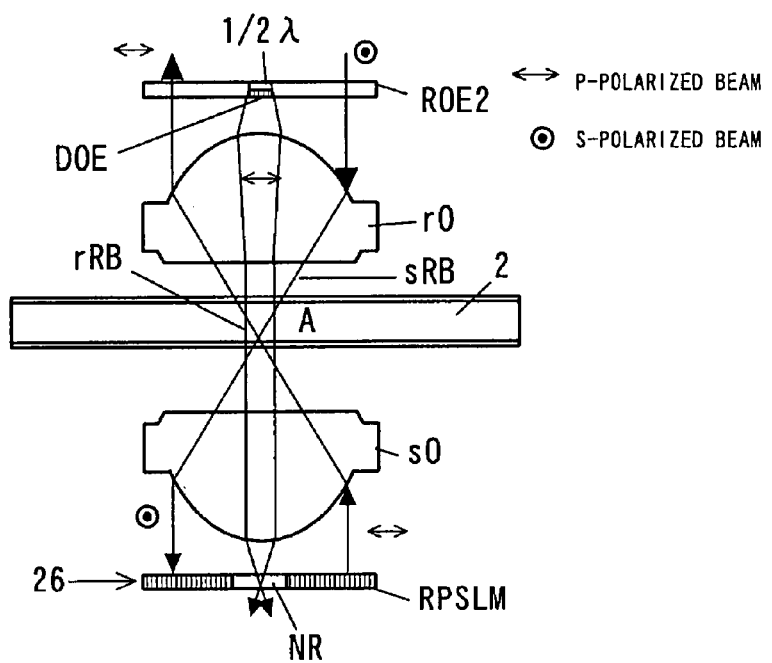

IN MODULATING (RECORDING)

METHOD FOR RECORDING AND REPRODUCING A HOLOGRAM AND APPARATUS THEREFOR

This application is a 371 of PCT/JP2006/305466, filed Mar. 13, 2006.

TECHNICAL FIELD

The present invention relates to a record carrier for optically performing recording or reproducing, e.g., an optical disk or an optical card, and more particularly to a hologram recording and reproducing method and apparatus having a hologram record carrier that can record or reproduce information by irradiating a light beam.

BACKGROUND ART

The prior art includes a disclosure that an object beam and a reference beam are separated to different optical paths and then the optical paths are joined again together to take the object beam at a periphery of a light beam and the reference beam at a center of the light beam, so that the object beam and the reference beam can be focused as circular polarizations different in rotating direction from each other concentrically on a recording medium, thereby causing interference between the two light beams in a thin-film polarization hologram record carrier (see WO 02/05270 A1).

Furthermore, there is known an art that a signal-beam optical system including a spatial light modulator is arranged opposite, sandwiching a recording medium, to a reference-beam optical system for exiting the reference beam so that reference and signal beams can be irradiated to an information record layer concentrically and at the same position in the surfaces opposite to each other while converging those to the minimal in diameter, thereby volumetrically recording a hologram in the recording medium (see Japanese Patent Laid-Open No. 2002-123948).

DISCLOSURE OF THE INVENTION

In the art of WO 02/05270 A1, a plurality of holograms are to be recorded and reproduced because of the interferences between all the incident and reflecting beams in the recording medium. Namely, as shown in FIG. 1, the holograms to be concretely recorded are four types, i.e., a hologram record A (reflecting reference beam and reflecting signal beam), a hologram record B (incident reference beam and reflecting signal beam), a hologram record C (reflecting reference beam and incident signal beam) and a hologram record D (incident reference beam and incident signal beam). Meanwhile, the holograms to be reproduced are four types, i.e., the hologram record A (to be read by a reflecting beam), the hologram record B (to be read by an incident beam), the hologram record C (to be read by a reflecting beam) and the hologram record D (to be read by an incident beam).

In the conventional method, the performance of the hologram record carrier is used ineffective because four holograms are to be recorded by the interferences between incident and reflecting reference and signal beams where recording a hologram in a reflective hologram record carrier. Accordingly, because the reference beam is reflected by the signal beam of the hologram record carrier when reproducing information, there is a need of a separation from a reproduced beam of from a reproduced hologram. Consequently, the reproduced signal deteriorates in its reading performance.

Furthermore, in the art of WO 02/05270 A1, because the reference beam reflects upon the reflection layer arranged over the back surface of the recording medium, the reference beam during reproduction is masked off immediately in front of a photo-detector, thereby separating between the reproduced beam and the reference beam.

The art of Japanese Patent Laid-Open No. 2002-123948 involves a difficulty in separating between the reference beam and the reproduced beam during reproduction. This is because the opposite objective lenses of the reference-beam and signal-beam optical systems are arranged sandwiching the recording medium wherein the reference and reproduced beams converging therefrom with the same focal point are focused, with an overlap, on the recording medium.

The prior art method accurately requires the precise alignment of the objective lens and recording medium because the both light beams of the reference and reproduced beams are focused on one point. In addition, there is complexity in the objective drive system and servo system because of the necessity to correctly maintain the relative spacing of between two objective lenses.

Meanwhile, in the both prior art methods, size reduction is desired for the apparatus because a number of optical components are needed for producing and joining together reference and signal beams.

Therefore, the problem that the invention is to solve includes, as one example, to provide a method and apparatus of recording and reproducing a hologram capable of performing recording or reproducing stably.

A hologram recording method in the invention is a method of recording a hologram, on a hologram recording apparatus having a pair of optical systems oppositely arranged spaced both on an optical axis sandwiching a hologram record carrier, the one pair of optical systems being made up by a reference-beam optical system having a reference-beam objective lens through which a reference beam is to be exited toward the hologram record carrier and a signal-beam optical system having a signal-beam objective lens through which a signal beam is to be exited toward the hologram record carrier, the signal-beam optical system including a spatial light modulator that produces the signal beam by modulation from the reference beam transmitted through the hologram record carrier according to record information, to record information by forming a diffraction grating through oppositely irradiating the signal beam and the reference beam to the hologram record carrier, the method comprising:

a step of focusing the reference beam at a first numerical aperture from a first effective diameter by means of the reference-beam objective lens;

a step of separating the reference beam in a part on the optical axis and a neighborhood thereof to thereby produce from the reference beam a recording reference beam to passes the hologram record carrier at a second numerical aperture smaller than the first numerical aperture, from a second effective diameter smaller than the first effective diameter by means of the reference-beam objective lens of the reference-beam optical system, and allowing same to exit coaxially to the reference beam; and a step of not allowing only the recording reference beam to exit toward the hologram record carrier by means of the signal-beam optical system.

A hologram reproducing method in the invention is a method of reproducing a hologram, that reproduces information from a hologram record carrier recording information in accordance with a hologram recording method according to claim 1, the method comprising:

a step of collecting the recording reference beam toward the hologram record carrier arranged between the reference-beam optical system and the signal-beam optical system, by means of the reference-beam objective lens; and a step of collecting and guiding, to a photo-detector, a reproduced beam from the diffraction grating of the hologram record carrier through which the recording reference beam transmits, by means of the reference-beam objective lens.

A hologram recording apparatus in the invention is an apparatus of recording a hologram, having a support that removably supports a hologram record carrier for storing an optical interference pattern as a diffraction grating therein, and an optical system pair made up by a reference-beam optical system for exiting a reference beam toward the hologram record carrier and a signal-beam optical system including a spatial light modulator that receives the reference beam and producing a signal beam modulated from the reference beam according to record information and for exiting the signal beam, that are oppositely arranged spaced on an optical axis sandwiching the hologram record carrier, thereby forming a diffraction grating through oppositely irradiating the signal beam and the reference beam to the hologram record carrier, the apparatus comprising:

the reference-beam optical system having a reference-beam objective lens that collects the reference beam at a first numerical aperture and optical separator means that is arranged coaxially to the reference-beam objective lens and has a function to separate the reference beam in a part on the optical axis and a neighborhood thereof and produce a recording reference beam to pass the hologram record carrier at a second numerical aperture smaller than the first numerical aperture from the reference-beam objective lens;

the signal-beam optical system having a signal-beam objective lens having the first numerical aperture and arranged coaxially to the reference-beam objective lens in a manner having a focal point coincident with a focal point of the reference-beam objective lens, the spatial light modulator having a non-reflective region that modulates the reference beam passed the signal-beam objective lens to thereby produce the signal beam without reflecting the recording reference beam.

A hologram reproducing apparatus in the invention is an apparatus of reproducing a hologram, including a photo-detector arranged in the reference-beam optical system and for detecting a reproduced beam produced from the hologram record carrier through irradiating the recording reference beam and optical means for guiding the reproduced beam from the reference-beam objective lens to the photo-detector, in addition to the foregoing hologram recording apparatus.

An optical pickup device in the invention is an optical pickup device, that records or reproduce information to or from a hologram record carrier for storing therein, as diffractive grating, an optical interference pattern based on a reference beam and a signal beam the reference beam is modulated according to record information, the device comprising:

a light source that generates a coherent reference beam;

an optical system pair oppositely arranged spaced on an optical axis sandwiching the hologram record carrier and made up by a reference-beam optical system that exits the reference beam toward the hologram record carrier and a signal-beam optical system that receives the reference beam and exits a signal beam;

a reference-beam objective lens arranged in the reference-beam optical system and for collecting the reference beam at a first numerical aperture;

optical separator means arranged coaxially to the reference-beam objective lens in the reference-beam optical system and for separating the reference beam in a part on the optical axis and a neighborhood thereof and producing a recording reference beam to pass the hologram record carrier at a second numerical aperture different from the first numerical aperture from the reference-beam objective lens;

a signal-beam objective lens arranged in the signal-beam optical system and arranged having the first numerical aperture and coaxially to the reference-beam objective lens in a manner having a focal point coincident with a focal point of the reference-beam objective lens;

a spatial light modulator arranged in the signal-beam optical system and having a non-reflective region that modulates the reference beam passed the signal-beam objective lens to thereby produce the signal beam without reflecting the recording reference beam; and a photo-detector for detecting a reproduced beam produced from the hologram record carrier through irradiating the recording reference beam and optical means for guiding the reproduced beam from the reference-beam objective lens to the photo-detector, that are arranged in the reference-beam optical system.

BRIEF DESCRIPTION OF THE DRAWINGS

FIG. 12 is a schematic fragmentary sectional view explaining a hologram record carrier in an embodiment according to the invention.

FIGS. 13 to 15 are schematic structural views explaining a pickup recording and reproducing optical system of a hologram apparatus in an embodiment according to the invention.

FIGS. 16 to 18 are schematic structural views explaining a pickup recording and reproducing optical system of a hologram apparatus in another embodiment according to the invention.

FIG. 23 is a schematic fragmentary sectional view explaining a hologram recording scheme to the hologram record carrier in another embodiment according to the invention.

FIG. 24 is a schematic fragmentary plan view explaining a hologram recording scheme to the hologram record carrier in another embodiment according to the invention.

FIG. 25 is a front view of a pickup of a hologram apparatus in another embodiment according to the invention, as viewed on the optical axis of the spatial light modulator.

DETAILED DESCRIPTION OF THE INVENTION

With reference to the drawings, explanation will now made below on embodiments according to the present invention.

—Hologram Apparatus—

Figure 1:
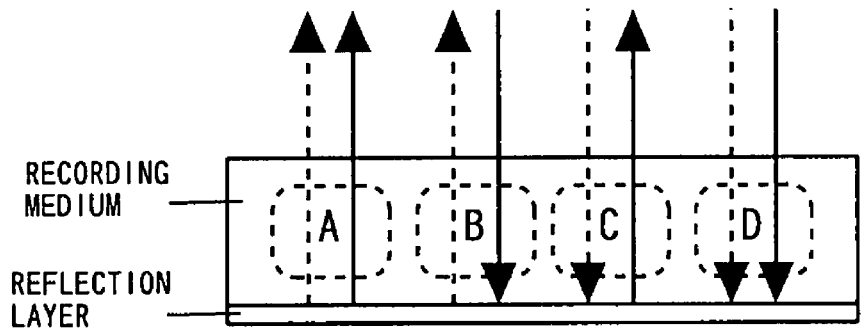
FIG. 1 is a schematic fragmentary sectional view showing a hologram record carrier for explaining the conventional hologram recording.
Figure 2:
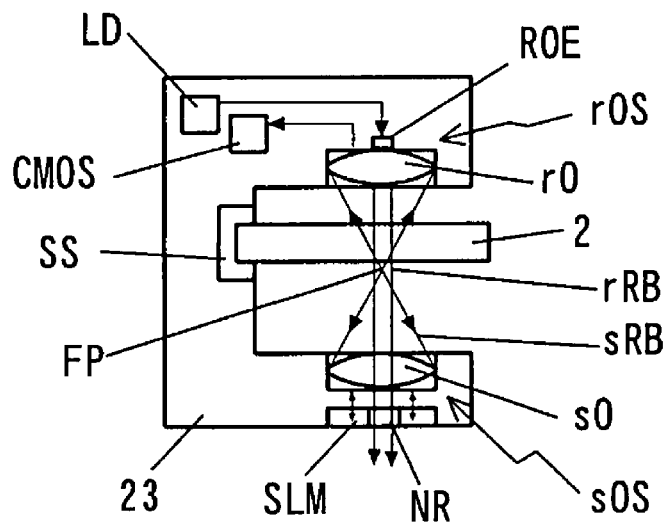
FIG. 2 is a schematic structural view explaining a hologram apparatus of an embodiment according to the present invention.

FIG. 2 shows an optical pickup device of a hologram apparatus in an embodiment.

In a pickup 23 of the hologram apparatus, a reference-beam optical system rOS and a signal-beam optical system sOS are provided independently sandwiching a hologram record carrier 2. The optical systems in pair are oppositely arranged spaced on an optical axis, sandwiching the hologram record carrier 2. The reference-beam optical system rOS has a reference-beam objective lens rO for generating a recording reference beam rRB and receiving are produced signal. The signal-beam optical system sOS has a signal-beam objective lens sO for spatially modulating a signal. The reference-beam objective lens rO and the signal-beam objective lens sO are arranged such that the both have a common focal point FP.

The hologram apparatus is provided with a support SS for removably, movably supporting the hologram record carrier 2 such that the hologram record carrier 2 is arranged between the common focal point FP of the reference-beam objective lens rO and signal-beam objective lens sO and the reference-beam objective lens rO or signal-beam objective lens sO.

The reference-beam optical system rOS of the hologram apparatus includes a laser light source LD that records and reproduces a hologram in a manner serving as a light source to generate a coherent reference beam, optical elements such as a collimator lens and a polarization beam splitter, and a image sensor IS formed by arrays of a CCD or complementary metal-oxide film semiconductor device, besides the reference-beam objective lens rO.

The signal-beam optical system sOS includes, on the side opposite to its incidence, a spatial-light modulator SLM that produces a signal beam from the reference beam transmitted the hologram record carrier 2 through a modulation according to recording information, besides the signal-beam objective lens sO.

In the present embodiment, the reference-beam objective lens rO is to focus, at a first numerical aperture, the reference beam of from the laser light source LD on the focal point FP, through the first effective diameter thereof.

—Optical Separator Means—

Furthermore, the reference-beam optical system rOS includes optical separator means ROE arranged coaxial to the reference-beam objective lens rO. The optical separator means ROE separates the light beam, passing through the reference-beam objective lens rO, at its central portion including the optical axis into a recording reference beam rRB and at its peripheral outer annular portion into a recording reference beam rRB. The optical separator means ROE is to determine a lens effective diameter and numerical aperture correspondingly to a recording reference beam rRB of a light beam to exit. Namely, the optical separator means ROE is to place the exiting light beam different in its wave front state parallel, converge or divergent with respect to a sectional area of the exiting light beam from the surrounding portion of the signal reference beam sRB. By the optical separator means ROE, a recording reference beam rRB is produced in a manner to pass the hologram record medium 2 from the reference-beam objective lens rO, at a second numerical aperture differently from, say smaller than, the first numerical aperture. The second numerical aperture may be zero, with which a recording reference beam rRB can be produced with a parallel light beam. Incidentally, the recording reference beam rRB can be made as a divergent beam by means of the optical separator means ROE. In such a case, there is a need to consider an area of a central non-reflection region of the signal-beam optical system, referred later.

In this manner, the reference-beam optical system rOS is to separate with a recording reference beam rRB and a signal reference beam sRB and allows those to exit concentrically to the hologram record carrier 2 from the reference-beam objective lens rO.

Figure 3:
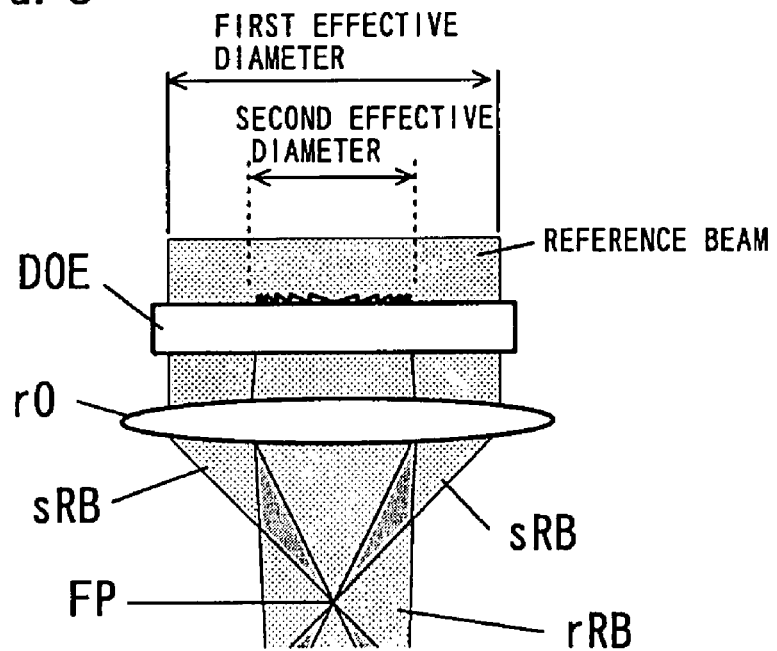
FIG. 3 is a schematic sectional view explaining a diffractive optical element and objective lens in the embodiment according to the invention.

FIG. 3 shows a use of a transmissive diffractive optical element DOE as an example of the optical separator means ROE. By using a transmissive diffractive optical element DOE arranged immediately in front of the reference-beam objective lens rO and closer to the light source, different focal lengths can be provided respectively for a recording reference beam rRB and a signal reference beam sRB. Namely, as shown in FIG. 3, the diffractive optical element DOE is capable of establishing a focal length for the central recording reference beam rRB to be significantly longer than the focal length FP of the peripheral signal reference beam sRB of from the reference-beam objective lens rO, e.g., so as to arrive at infinity or beyond a spatial light modulator SLM in the opposed signal optical system sOS. Accordingly, at the reference-beam objective lens rO, the second numerical aperture of the recording reference beam rRB is smaller than the first numerical aperture of the signal reference beam sRB.

Figure 4:
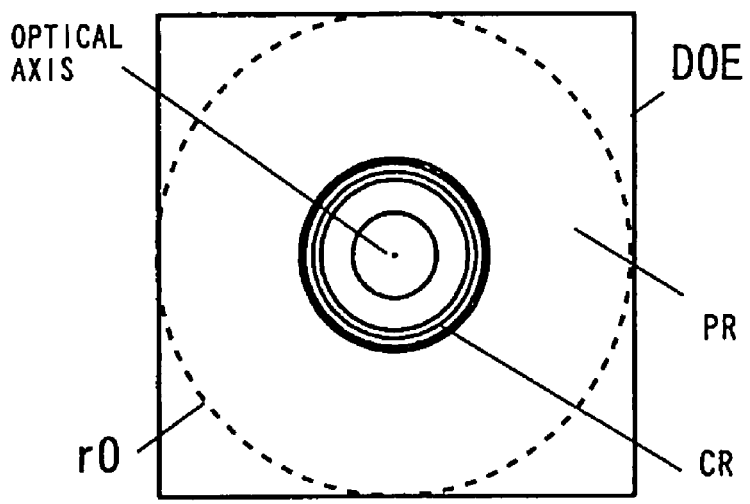
FIG. 4 is a front view of a diffractive optical element in the embodiment according to the invention, as viewed on the optical axis thereof.

FIG. 4 shows the diffractive optical element DOE to be used for the reference-beam objective lens rO, which separates a reference beam on the optical axis into two, a signal reference beam sRB and a recording reference beam rRB. The diffractive optical element DOE is formed by a light-transmissive flat plate, with a diffractive annular zone (rotary symmetric pattern about the optical axis), i.e., a central region GR including the optical axis of a diffraction grating and a peripheral annular region PR.

The diffractive optical element DOE is formed with a diffraction grating serving as a concave lens function in order to make the light beam passing the central region GR into a collimated or converging beam when transmitting through the reference-beam objective lens rO. The concave lens action at the central region GR defines a second numerical aperture for the signal reference beams RB. The refractive optical element DOE corresponds to a non-reflective region of the signal-beam optical system, referred later. The diffractive optical element DOE (central region GR) has a diameter defining a second effective diameter for the signal reference beam sRB. Meanwhile, the annular region PR is provided as a portion not having any optical function at all. Alternatively, in the central region GR, a concave lens or a concave Fresnel lens may be arranged in place of the diffraction grating. The first effective diameter, for the signal reference beam sRB, of the reference-beam objective lens rO is provided greater than the second effective diameter for the recording reference beam rRB. This is because intensity is higher centrally by reason of the Gaussian distribution of light beam.

Figure 5:
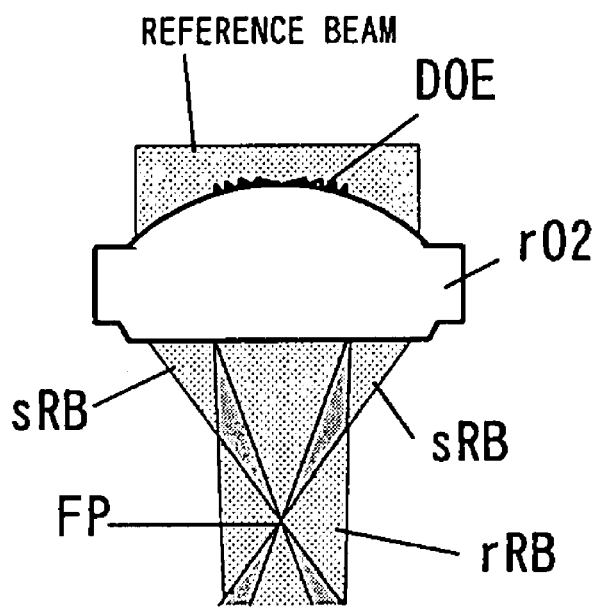
FIGS. 5 and 6 are schematic sectional views explaining a diffractive optical element and objective lens in another embodiment according to the invention.

FIG. 5 shows the reference-beam objective lens rO2, so-called a two-focal lens, integrated with the diffractive optical element DOE serving as other optical separator means ROE.

The two-focal reference-beam objective lens rO2 may be in a form that an annular diffractive grating is provided in the central region on the optical axis of its diffractive surface and a convex lens is left around the same, or conversely in a form that an annular diffractive grating is provided in a ring-like region and a convex lens is left in the central region thereof. Alternatively, an annular diffractive grating may be provided in the central and annular regions thereby structuring a two-focal reference-beam objective lens rO2. Furthermore, the two-focal reference-beam objective lens rO2 may be formed as an aspheric lens.

Figure 6:
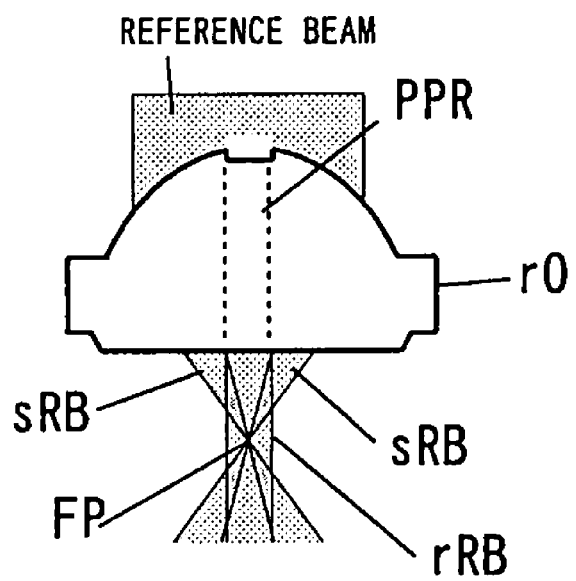

Furthermore, as shown in FIG. 6, the optical separator means ROE can be made as a parallel plate region PPR integrally formed, as an aspheric lens, in the central region on the optical axis of the reference-beam objective lens rO on the optical axis. In case the aspheric lens is arranged such that its main surface is vertical to the optical surface (though similar in other example), separating function can be achieved such that the signal reference beam sRB is converged while the recording reference beam rRB is made as a nearly collimated light in the hologram record carrier 2 by means of the diffractive optical element arranged immediately in front of the objective lens.

—Spatial Light Modulator—

As shown in FIG. 2, the diverging signal reference beam sRB, transmitted through the hologram record carrier 2 and the focal point FP, is changed into a collimated beam by the signal-beam objective lens sO and guided to the spatial light modulator SLM.

Between the signal-beam objective lens sO and the spatial light modulator SLM, a region to transmit or absorb a light beam, i.e., a non-reflective region NR, is provided on the optical axis. Otherwise, the region to transmit or absorb a light beam, i.e., a non-reflective region NR, may be provided on the optical axis in the spatial light modulator SLM so that the recording reference beam rRB cannot structurally return to reference-beam optical system rOS. Meanwhile, in the passing region for the signal reference beam sRB at around the non-reflective region NR, the signal reference beam sRB is modulated and reflected by the function of the spatial light modulator SLM, to generate a signal beam that is collected onto the hologram record carrier 2 by means of the signal-beam objective lens sO. On this occasion, the signal reference beam sRB is modulated according to record information by the spatial light modulator SLM, whose polarization state is made same as the polarization state of the recording reference beam rRB thereby producing a signal beam.

Accordingly, in the hologram record carrier 2, a hologram is recorded by the interference between the incident recording reference beam rRB and the reflecting signal beam that are identical in polarization state.

The point to notice lies in that the recording reference beam rRB is not to return during irradiation of the recording reference beam rRB but a reproduced beam only is to return to the reference-beam optical system rOS during reproduction.

The non-reflective region NR, not to reflect the recording reference beam rRB, is a through-opening allowing the recording reference beam rRB to pass therethrough. Otherwise, the non-reflective region NR may be formed by filling the opening with a transparent material or an absorbing material absorbing it.

Figure 7:
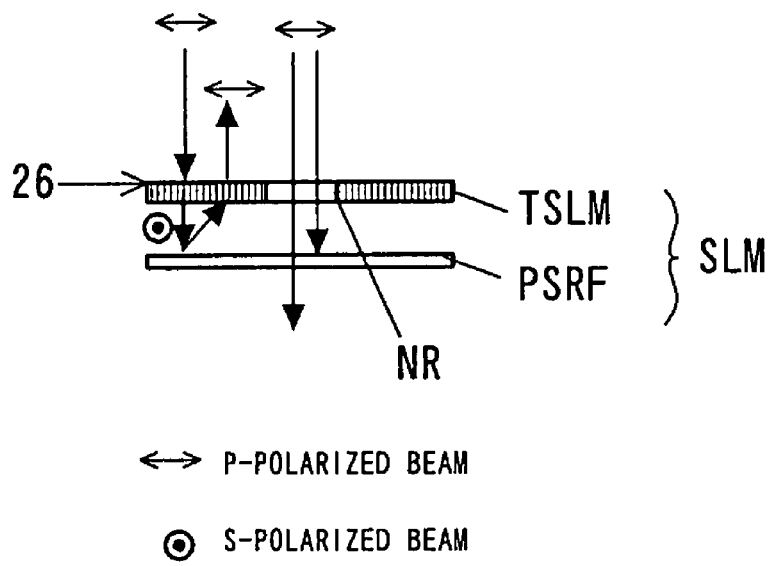
FIG. 7 is a sectional view of a spatial light modulator of a hologram apparatus in an embodiment according to the invention, as viewed on the optical axis thereof.

FIG. 7 shows a structural example of the spatial light modulator SLM, illustrating a structure with a transmissive spatial light modulator TSLM and a polarization-selective reflection film PSRF that are arranged in the closer order to the signal-beam objective lens sO and parallel with each other.

Figure 8:
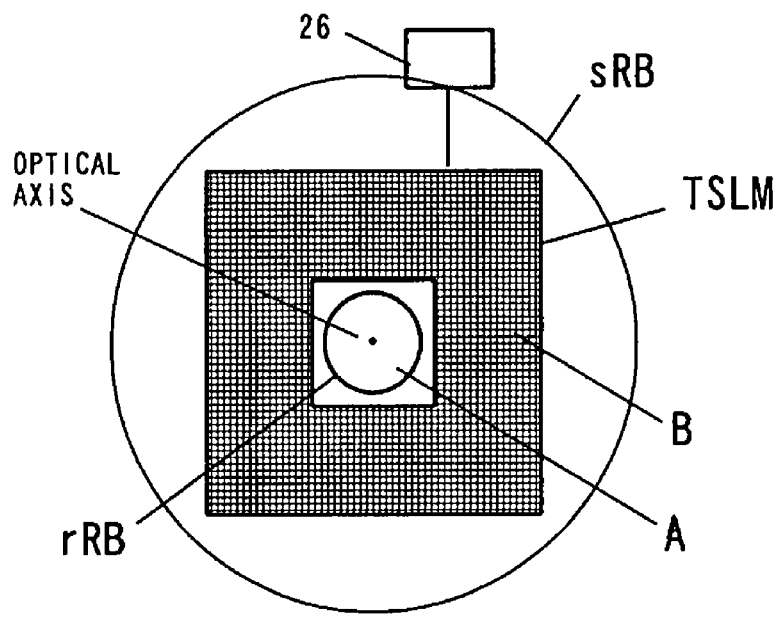
FIG. 8 is a front view of a spatial light modulator of a pickup of a hologram apparatus in an embodiment according to the invention, as viewed on the optical axis thereof.

As shown in FIG. 8, the transmissive spatial light modulator TSLM is demarcated with a central region A including the optical axis at around the optical axis and a spatial light modulating region B surrounding it and not including the optical axis. In spatial modulation, modulation is given to the light beam transmitting through the transmissive spatial light modulating region B, wherein the central region A is as the non-reflective region NR. The signal reference beam sRB is spatially modulated at the time transmitting through the spatial light modulating region B.

The transmissive spatial light modulating region B has a function to electrically shade a part of incident beam on a pixel-by-pixel basis by means of a liquid-crystal panel having a plurality of pixel electrodes segmented in a matrix form or a function to transmit the entire into a spatially non-modulated state. The spatial light modulator SLM is connected to a drive circuit 26 so that a light beam can be modulated and transmitted to have a distribution based on the page data (two-dimensional information pattern such as a light/dark dot pattern on a plane) to record provided therefrom, thereby generating a signal reference beam sRB. The transmissive spatial light modulator TSLM uses a TN liquid crystal panel.

As shown in FIG. 7, if not performing spatial modulation by the transmissive spatial light modulator TSLM, the both light beams pass through the modulator TSLM without undergoing any polarization action. When performing spatial modulation, the P-polarized beam transmitted the transmissive spatial light modulator TSLM (two-way arrow indicative of parallel with the page) is to transmit while undergoing a polarization action thus being changed into an S-polarized beam (center-blacked dot-lined circle indicative of vertical to the page.

Figure 9:
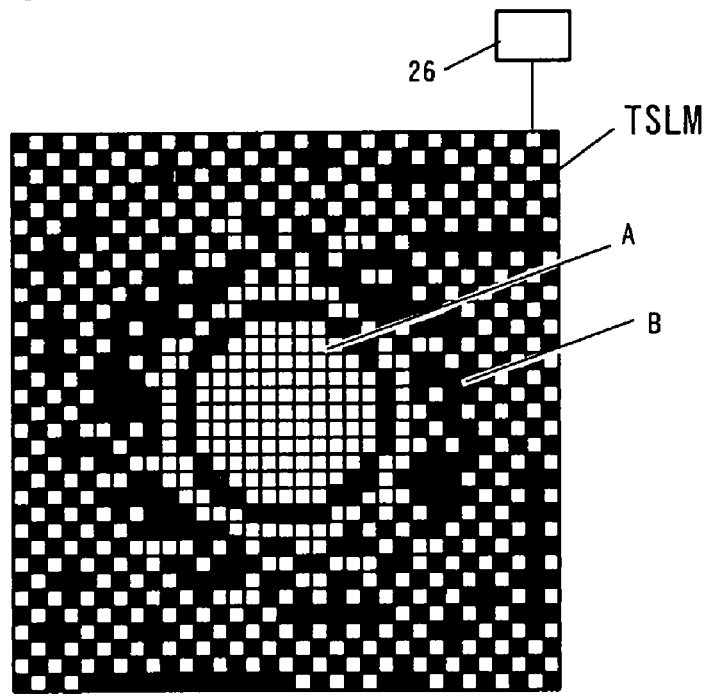
FIGS. 9 and 10 are front views of a spatial light modulator of a pickup of a hologram apparatus in another embodiment according to the invention, as viewed on the optical axis thereof.

Furthermore, the transmissive spatial light modulator TSLM can be structured in its entirety as a transmissive matrix liquid-crystal unit as shown in FIG. 9 so that the drive circuit 26 can display a spatially light modulated region B in a predetermined pattern display and a non-reflective region NR as a non-modulated light transmission region of the central region A in the inward thereof.

As shown in FIG. 7, the polarization-selective reflection film PSRF is a plate-like optical element having a function to absorb one of the light beams orthogonal in polarization direction to each other, e.g., a P-polarized beam and reflect the other, i.e., an S-polarized beam.

Figure 10:
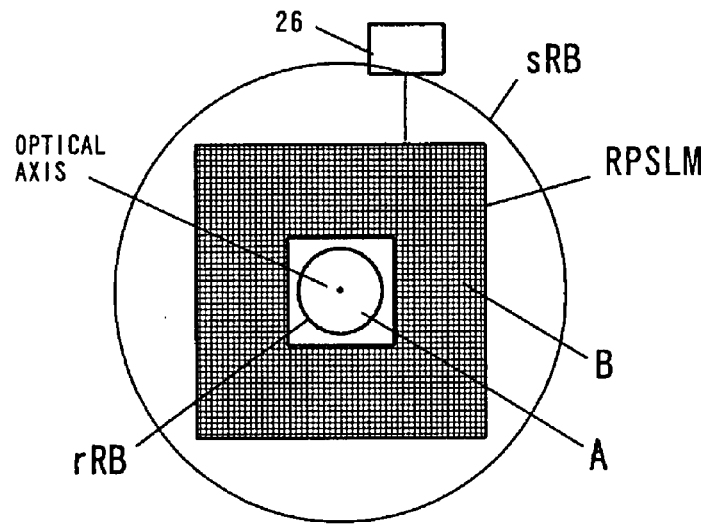

The spatial light modulator SLM, a combination of the transmissive spatial light modulator TSLM and the polarization-selective reflection film PSRF, is to reflect only the S-polarized signal beam that is according to the pattern displayed on the transmissive spatial light modulator TSLM FIG. 10 shows a reflective polarization spatial light modulator RPSLM as another example of the spatial light modulator SLM. The reflective polarization spatial light modulator RPSLM is so-called a LCOS (liquid crystal on silicon) device that is demarcated with a central region A as the foregoing non-reflective region NR including the optical axis at around the optical axis and a spatial light modulating region B surrounding it and not including the optical axis. P-polarized or S-polarized modulation is given to the light beam reflecting at the spatial light modulating region B. In the case modulation is not given to the incident beam (non-driven area) at the reflective polarization spatial light modulator RPSLM, the light beam reflects remaining in the incident-polarization state wherein, in the area modulation is given (driven area), reflection is made with a change of polarization direction from S-polarization into P-polarization. Accordingly, the reflection beam includes an S-polarized component not carrying data and a P-polarized component carrying data.

The reflective polarization spatial light modulator RPSLM has a function to electrically polarize a part of an incident beam on a pixel-by-pixel basis by means of a liquid-crystal panel having a plurality of pixel electrodes segmented in a matrix form. The reflective polarization spatial light modulator RPSLM is connected to the drive circuit 26 so that modulation can be made as to light-beam polarization direction in a manner having a distribution based on the page data (two-dimensional information pattern such as a light/dark dot pattern on a plane) to record provided therefrom, thereby generating a signal beam containing a predetermined polarized component. Meanwhile, the reflective polarization spatial light modulator RPSLM can maintain the same polarization direction of between incidence and reflection.

Where the reflective polarization spatial light modulator RPSLM is used, polarization-directional component can be regulated on the reflecting light beam. By previously making the polarization state different between the recording reference beam rRB and the signal reference beam sRB, structure can be provided for interference only with the recording reference beam rRB. It can be considered to arrange a ½ wavelength plate on any optical path in order to make different the polarization state between the recording reference beam rRB and the signal reference beam sRB.

—Optical System Other Arrangement—

Figure 11A:
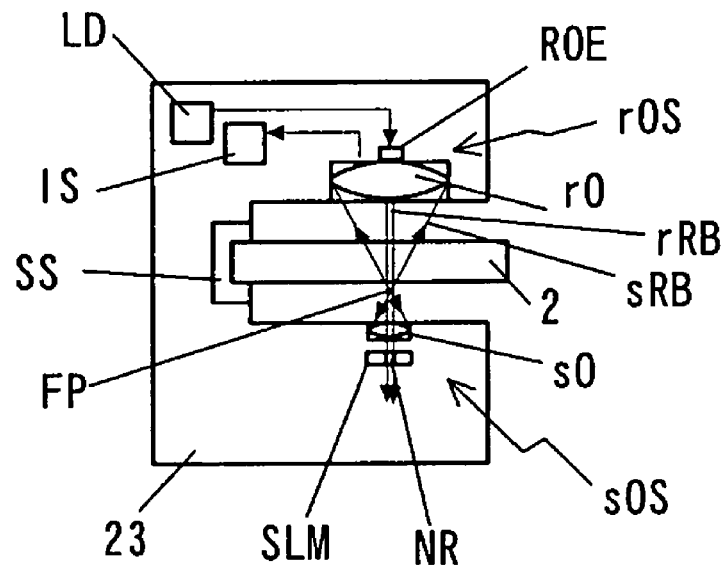
FIG. 11 is a schematic structural view explaining a hologram apparatus in another embodiment according to the invention.
Figure 11B:
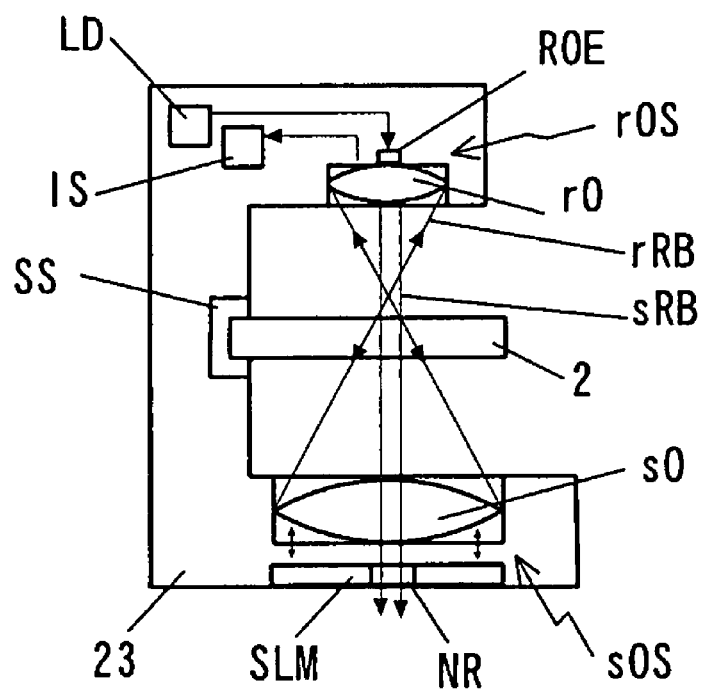
Figure 1:
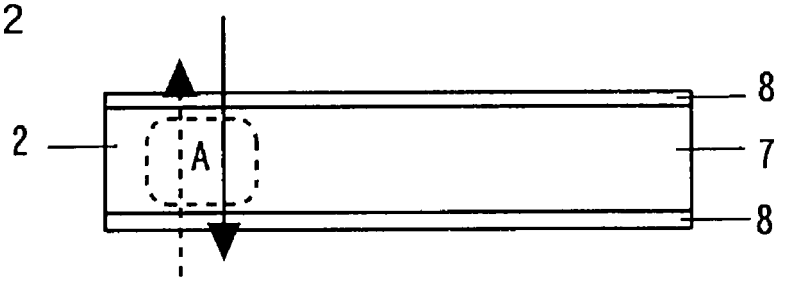
Figure 1:
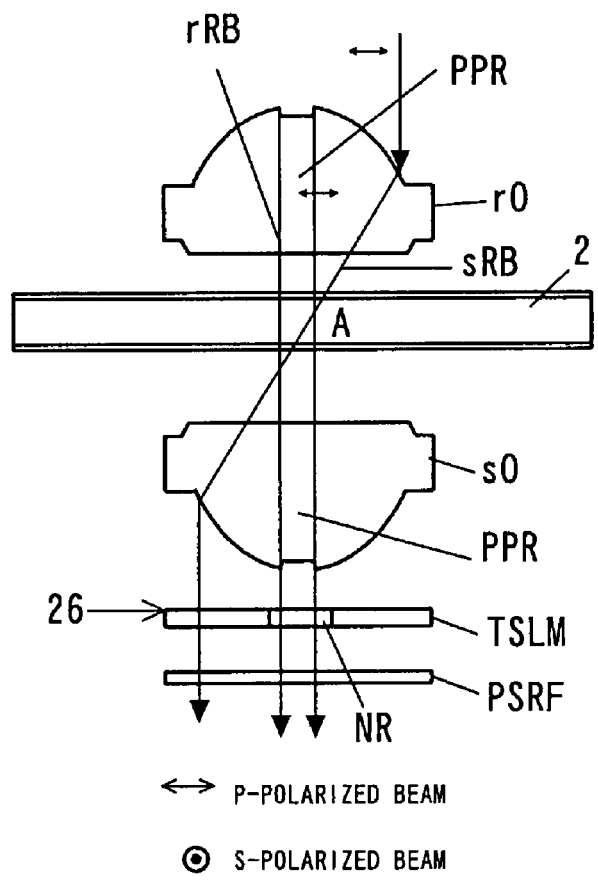

Note that the signal-beam objective lens sO and the reference-beam objective lens rO may be different in their focal lengths provided that those are identical in focal point and numerical aperture. As shown in FIGS. 11A and 11B, the signal-beam objective lens sO can be smaller (FIG. 11A) or greater (FIG. 11B) in effective diameter than the reference-beam objective lens rO. By arranging the hologram record carrier 2 on a side closer to the reference-beam objective lens rO or the signal-beam objective lens sO which is greater in focal length, the movable range can be broadened for the hologram record carrier 2.

—Operation of Hologram Apparatus—

In the hologram recording system, the optical interference pattern, caused by the recording reference beam rRB incident upon the hologram record carrier 2 and the signal reference beam sRB returning due to reflection, is saved as a diffraction grating DP in the hologram record carrier 2.

As shown in FIG. 12, the hologram concretely carrying information, to be recorded, is of one type of hologram record A (incident reference beam and reflecting signal beam) provided that polarization state is identical between the recording reference beam rRB and the signal reference beam sRB. Although overlap occurs between the recording reference beam rRB and the signal reference beam sRB during incidence, recording is free of data, say, in a uniform pattern free of modulation.

Accordingly, in the hologram reproduction system for reproducing information from such a hologram record carrier, in case a recording reference beam rRB is caused to transmit as shown in FIG. 2, a reproduced beam only can be caused from the diffractive grating DP. The reproduced beam can be guided to the image sensor IS through the reference-beam objective lens rO forming a part of the detection means.

According to the above structure, unnecessary holograms are not recorded in recording a hologram because there is no reflection of a signal reference beam sRB. Meanwhile, because the recording reference beam rRB and the signal reference beam sRB are to be established as spherical waves that propagate in the directions opposite to each other (excepting the case the recording reference light rRB is a collimated planar wave), the intersection angle of those can be taken comparatively great, thus making it possible to reduce the multi-spacing.

As described so far, the present embodiment allows to receive only a reproduced beam of from a required hologram because there is no reflection of a recording reference beam rRB during reproduction. As a result, reproduction SN improves to enable a stable reproduction.

—Hologram Record Carrier—

As shown in FIG. 12, the hologram record carrier 2 is structured with a hologram recording layer 7 sandwiched by protection layers 8. No reflection layers are formed in the hologram record carrier 2. In order to store internally an optical interference pattern based on reference and signal beams as a diffraction grating (hologram), the material of the hologram recording layer uses a light-transmissive light-sensitive material capable of storing an optical interference pattern, e.g., photopolymer, optically isotropic material, photo refractive material, hole burning material or photochromic material.

The protection layer 8 is of a light transmissive material, e.g., glass, plastic such as polycarbonate, amorphous polyolefin, polyimide, PET, PEN or PES, or UV-setting acrylic resin.

FIRST EMBODIMENT OF RECORDING AND REPRODUCING OPTICAL SYSTEM

A recording and reproducing optical system in a first embodiment is shown in FIGS. 13 to 15.

The light beam, emitted from a laser light source for recording and reproducing, is made into a collimated beam by a collimator lens and incident, at P-polarization, upon the reference-beam objective lens rO.

The reference-beam objective lens rO is made not to effect any action on the light beam transmitting through the vicinity of the optical axis. Specifically, the reference-beam objective lens rO has a curvature of infinity (parallel-plated region PPR) in a portion nearby the optical axis. Due to this, the light beam, transmitted the reference-beam objective lens rO is made as a collimated recording reference beam rRB in a portion nearby the optical axis.

In this manner, the collimated light beam in a portion nearby the optical axis of the reference-beam objective lens rO is separated as recording reference beam rRB for recording a hologram while the other portion of transmitting light beam around the optical axis is as a signal reference beam sRB.

The both light beams, transmitted through the reference-beam objective lens rO, are to enter the hologram recording carrier 2.

The both light beams, transmitted through the hologram recording carrier 2, are to enter the signal-beam objective lens sO.

For the signal-beam objective lens sO having the same numerical aperture NA as the reference-beam objective lens rO, a parallel-plated region PPR can be provided which has the similar optical function as the reference-beam objective lens rO at a central region on its optical axis. This can maintain the both light beams separated and facilitate the alignment in the manufacture. The signal-beam objective lens sO allows the recording reference beam rRB, entered as a collimated beam nearby the optical axis, to transmit remaining as the collimated beam while changing the other portion of the signal reference beam sRB into a collimated beam.

The special light modulator uses a TN liquid-crystal panel as a transmissive spatial light modulator TSLM (see FIG. 9). When not to perform special modulation, the both light beams pass through the transmissive spatial light modulator TSLM in a non-display light-transmissive state without experiencing any polarizing action as shown in FIG. 13. In back of the transmissive spatial light modulator TSLM, a polarization-selective reflection film PSRF is arranged. The polarization-selective reflection film PSRF is to transmit or absorb a P-polarized beam and to reflect an S-polarized beam.

As shown in FIG. 14, where to perform special modulation, the transmissive spatial light modulator TSLM is caused to display thereon a pattern not to modulate the recording reference beam rRB in the light beam on the optical axis. Consequently, absorption or transmission is made in or through the polarization-selective reflection film PSRF without returning to the signal-beam objective lens sO. The pattern display not for modulation constitutes a non-reflective region NR not to reflect the recording reference beam rRB at the transmissive spatial light modulator TSLM or the polarization-selective reflection film PSRF.

By the displaying (in the spatial modulation area) on the transmissive spatial light modulator TSLM, modulation is given to the signal reference beam sRB at around the recording reference beam rRB. By the TN liquid crystal, the modulating region becomes an S-polarization state. As a result, reflection is made by the polarization-selective reflection film PSRF and incidence is made again upon the transmissive spatial light modulator TSLM, returning the polarization state again into P-polarization. The portion not modulated is absorbed in or reflected by the polarization-selective reflection film PSRF.

The signal beam thus modulated/reflected transmits through the signal-beam objective lens sO and travels towards the hologram record carrier 2, also exiting along the same optical path as the signal reference beam sRB. The signal beam, after focused on the common focal point, interferes with the recording reference beam rRB when transmitting through the hologram record carrier 2, thus being changed into a collimated beam through the reference-beam objective lens rO.

Hologram recording in the hologram record carrier 2 is made by the interference of a collimated light beam of the recoding reference beam rRB nearby the optical axis with the signal beam propagating oppositely to it.

The recording reference beam rRB, transmitted the hologram record carrier 2, passes through the spatial light modulator SLM because not undergoing a modulation action therein, thus being not to return toward the hologram record carrier 2. Meanwhile, the signal beam, changed in its polarization state, is reflected by the polarization-selective reflection film PSRF. However, the signal beam's polarization becomes the same in state as the recording reference beam rRB because of transmission again through the same spatial light modulator SLM.

As a result, the light beams to interfere in the hologram record carrier 2 are of two types while the holograms to be recorded are of two types, i.e., a hologram A (incident recording reference beam rRB and incident non-modulated signal reference beam sRB) and a hologram B (incident recording reference beam rRB and reflecting signal beam).

As shown in FIG. 15, in reproducing a hologram, the light beam containing a recording reference beam rRB in the polarization state as in recording is caused to enter to the reference-beam objective lens rO. The holograms to be reproduced by the recording reference beam rRB nearby the optical axis are A and B, wherein the hologram B is an incident non-modulated signal reference beam sRB whose reproduced signal is to be caused in the direction toward the backside of the hologram recording carrier 2. The reproduced beam is of P-polarization and hence transmitted through or reflected by the polarization-selective reflection film PSRF, thus not allowed to return toward the reference-beam objective lens rO. Meanwhile, the reproduced beam (broken line) from the hologram A occurs on the side of the reference-beam objective lens rO. By receiving the reproduced beam at a light-receiving element, a reproduced signal can be obtained.

SECOND EMBODIMENT OF RECORDING AND REPRODUCING OPTICAL SYSTEM

Figure 18:
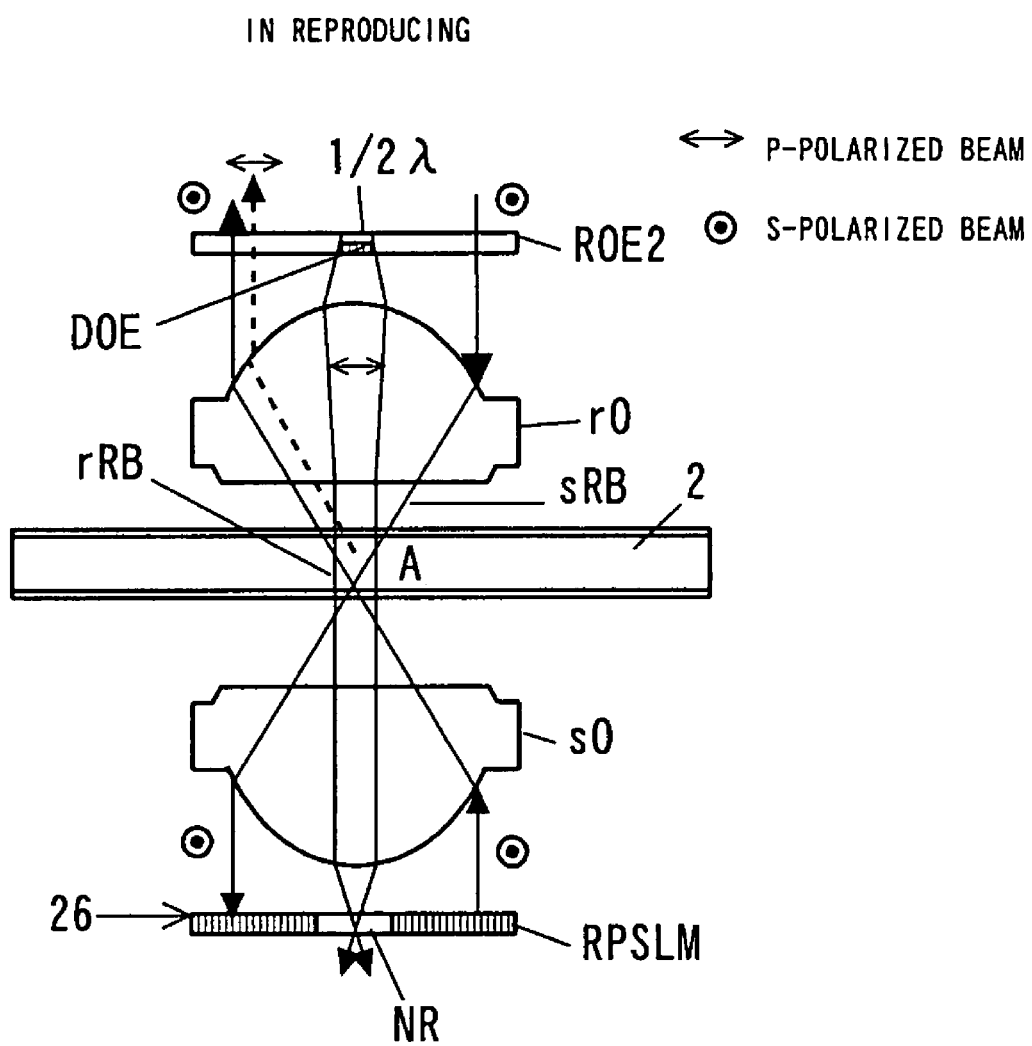

A recording and reproducing optical system in a second embodiment is shown in FIGS. 16 to 18.

Although the first embodiment was in the case the recording reference beam rRB and the signal reference beam sRB are in the same polarization state, the second embodiment is on the case the recording reference beam rRB and the signal reference beam sRB are in different polarization state. In order to previously make different the polarization state between the recording reference beam rRB and the signal reference beam sRB, a ½ wavelength plate is arranged only on an optical path of the recording reference beam rRB. Furthermore, the second embodiment uses a diffractive optical element in order to separate between the recording reference beam rRB and the signal reference beam sRB, and a reflective polarization spatial light modulator in order to separate a reproduced beam.

The present inventor proposes second optical separator means ROE2 as optical separator means having a composite functions.

As shown in FIG. 16, the second optical separator means ROE2 is an optical separator element formed by a ½ wavelength plate ½λ that changes the polarization state of an S-polarized light beam into a P-polarized beam and a diffractive optical element DOE having a concave lens function, that are laid in the closer order to the light source in an area having a predetermined radius about the optical axis. The optical separator element is formed by a light-transmissive plate, with a ½ wavelength plate and concave-lens-functioning diffractive optical element DOE that are laid within a predetermined radius of central region about the optical axis, to define a recording reference beam rRB with a diameter of its transmission light beam. The concave-lens-functioning diffractive optical element DOE is set up to provide a collimated light beam in the hologram record carrier 2 in a state combined with a reference-beam objective lens rO. Accordingly, the light beam, passing the second optical separator means ROE2 and reference-beam objective lens rO, is separated as a collimated recording reference beam rRB on the optical axis and a signal reference beam sRB in the peripheral annular light beam. The recording reference beam rRB and the signal reference beam sRB are 90 degree different in polarization state.

Incidentally, although the second embodiment showed the second optical separator means ROE2 that the ½ wavelength plate ½λ and the diffractive optical element are integrated together to separate between a recording reference beam rRB and a signal reference beam sRB, those can be structured arranged separately spaced on the optical axis.

In this manner, as shown in FIG. 16, the second optical separator means ROE2 separates an S-polarized collimated light beam in a portion nearby the optical axis of the reference-beam objective lens rO into a P-polarized recording reference beam rRB wherein the other portion of e transmission light beam around the optical axis is changed into an S-polarized signal reference beam sRB.

The both light beams, transmitted through the reference-beam objective lens rO, enter a hologram record carrier 2. The both light beams, transmitted through the hologram record carrier 2, enter a signal-beam objective lens sO.

The signal-beam objective lens sO is to collect the recording reference beam rRB entered as a collimated light at the region nearby the optical axis and to change the signal reference beam sRB in the periphery thereof into a collimated beam.

The signal-beam objective lens sO is to collect the recording reference beam rRB nearby the optical axis, as a significantly small light spot on the optical axis of the reflective polarization spatial light modulator RPSLM on the optical axis. The reflective polarization spatial light modulator RPSLM is provided with such a pinhole (non-reflective region NR) as to transmit the recording reference beam rRB. Meanwhile, although similar in the first embodiment, a spatial filter, etc. may be arranged as a non-reflective region NR, separately from the spatial light modulator, on the optical axis of the reflective polarization spatial light modulator RPSLM in a manner to absorb the recording reference beam rRB. The recording reference beam rRB is not reflected and hence not returned toward the signal-beam objective lens sO.

In the case not to modulate the incident beam at the reflective polarization spatial light modulator RPSLM, as shown in FIG. 16, the signal reference beam sRB reflects remaining in the incident state of S-polarization. No interference occurs between the S-polarized signal reference beam sRB and the P-polarized recording reference beam rRB.

In the case modulation is given to the incident beam at the reflective polarization spatial light modulator RPSLM, the portion modulated is changed in its S-polarization into reflection with P-polarization, as shown in FIG. 17. The P-polarized signal light, thus modulated and reflected, transmits through the signal-beam objective lens sO and travels toward the hologram record carrier 2, thus exiting also along the same optical path as the signal reference beam sRB. The signal beam, after focused on the common focal point, interferes with the recording reference beam rRB when passing the hologram record carrier 2, thus transmitting through the reference-beam objective lens rO and changed into a collimated beam.

The hologram in the hologram record carrier 2 is recorded by the interference between the collimated light beam of the recording reference beam rRB nearby the optical axis and the signal beam propagating oppositely to it.

The recording reference beam rRB, passed the hologram record carrier 2, transmits through or is absorbed in the pinhole of the reflective polarization spatial light modulator RPSLM, thus being not allowed to return toward the hologram record carrier 2. Meanwhile, the signal beam becomes P-polarization same as the recording reference beam rRB entering the hologram recording carrier 2 because of its reflection with a change of polarization state. As a result, the interfering light beam in the hologram record carrier 2 is one in type so that the hologram to be recorded is only hologram A (incident recording reference beam rRB and reflecting modulated signal beam) as shown in FIG. 17.

In reproducing a hologram, a recording reference beam rRB is incident upon the reference-beam objective lens rO, in a polarization state same as in recording, as shown in FIG. 18. The recording reference beam rRB nearby the optical axis becomes P-polarization and enters the hologram record carrier 2 while remaining as a collimated beam. This reproduces only one kind of hologram that is P-polarized in polarization direction.

The recording reference beam rRB is not to return toward the signal-beam objective lens sO because it transmits through the signal-beam objective lens sO and then transmits through or is absorbed in the pinhole or spatial filter of the reflective polarization spatial light modulator RPSLM. Meanwhile, even in the presence of a peripheral beam together with the recording reference beam rRB, the reflection beam remains in the S-polarized state if the spatial modulator is put off (to reflect S-polarization as S-polarization), which is different in polarization state from the hologram to reproduce and hence to be easily separated by use of a polarization beam splitter.

—Operation of Pickup—

Figure 19:
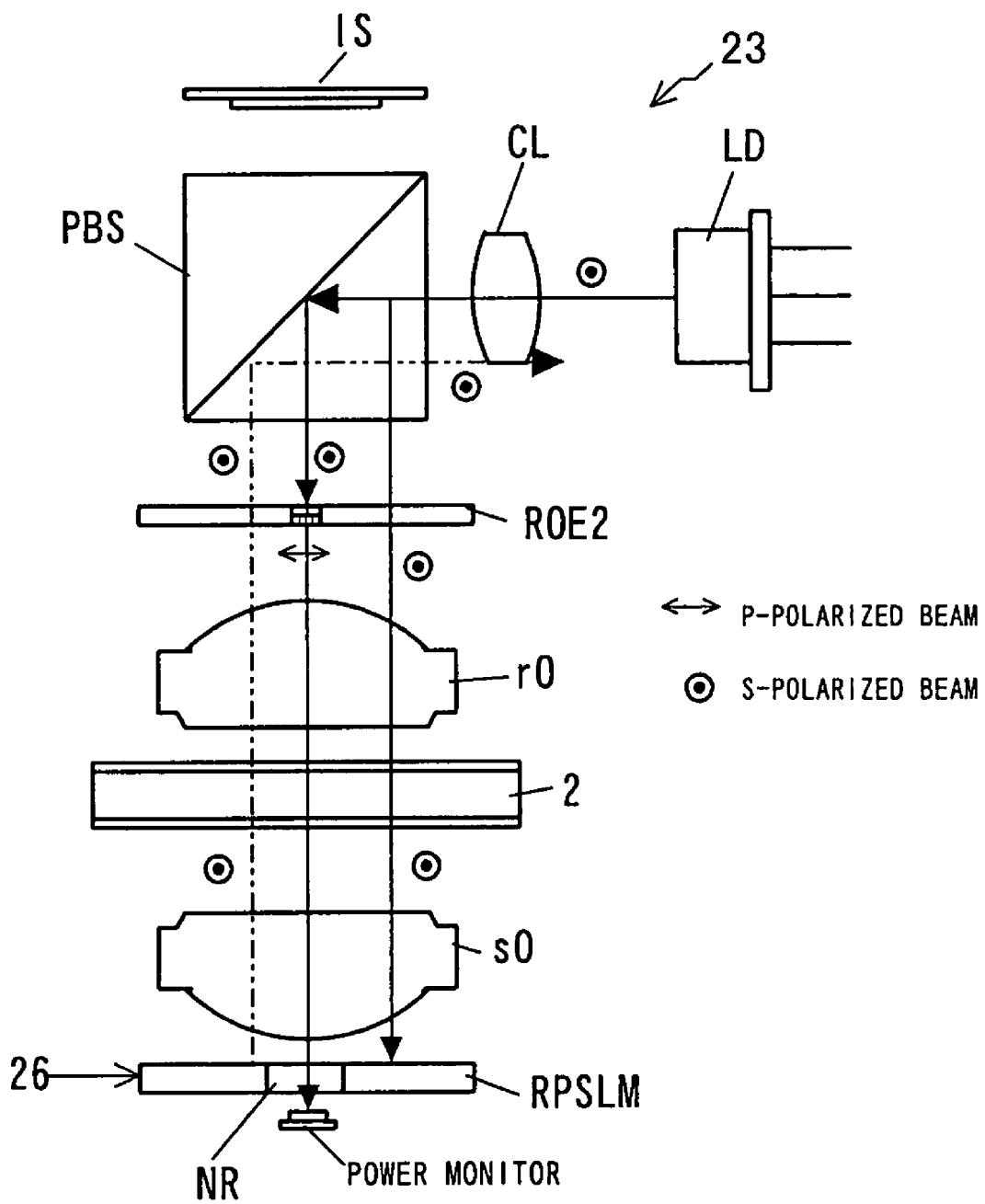
FIGS. 19 to 21 are schematic structural views explaining a pickup of a hologram apparatus in another embodiment according to the invention.

FIG. 19 shows a pickup structure using the recording and reproducing optical system of the second embodiment.

At first, the S-polarized coherent beam, emitted from a laser light source LD, is changed as a collimated light beam by a collimator lens CL and reflected by a polarization beam splitter PBS, to enter a reference-beam objective lens rO through the second optical separator means ROE2.

Combined with the optical action of the diffraction grating at the second optical separator means ROE2, the reference-beam objective lens rO allows the light beam portion nearby the optical axis to exit as a P-polarized collimated beam of recording reference beam rRB and simultaneously the peripheral light beam (recording reference beam rRB), free from the lens action of the second optical separator means ROE2, to exit as an S-polarized converging light beam.

The S-polarized signal reference beam sRB and the P-polarized recording reference beam rRB are focused on the hologram record carrier 2 by the reference-beam objective lens rO wherein no interference occurs.

The both light beams, transmitted through the hologram record carrier 2, enter the signal-beam objective lens sO where the recording reference beam rRB entering nearby the optical axis is focused while the signal reference beam sRB in the periphery thereof is changed into a collimated beam.

The converging P-polarized recording reference beam rRB transmits through the non-reflective region NR on the optical axis of the reflective polarization spatial light modulator RPSLM while the S-polarized signal reference beam sRB reflects upon the area around the non-reflective region NR. Incidentally, by providing a power monitor on the backside of the reflective polarization spatial light modulator RPSLM, the state of the light source can be monitored by means of the recording reference beam rRB transmitted. The recording reference beam rRB does not return toward the signal-beam objective lens sO because it is not reflected.

In the case of performing a non-modulating operation, when modulation is not given to the incident beam at the reflective polarization spatial light modulator RPSLM, the signal reference beam sRB reflects remaining in the incident S-polarized state and returns to the light source through the same optical path (two-dot chain line in FIG. 19) as in the incidence, as shown in FIG. 19. No holograms are recorded because of the different polarization state between the both light beams of the recording reference beam rRB and the signal reference beam sRB.

Figure 20:
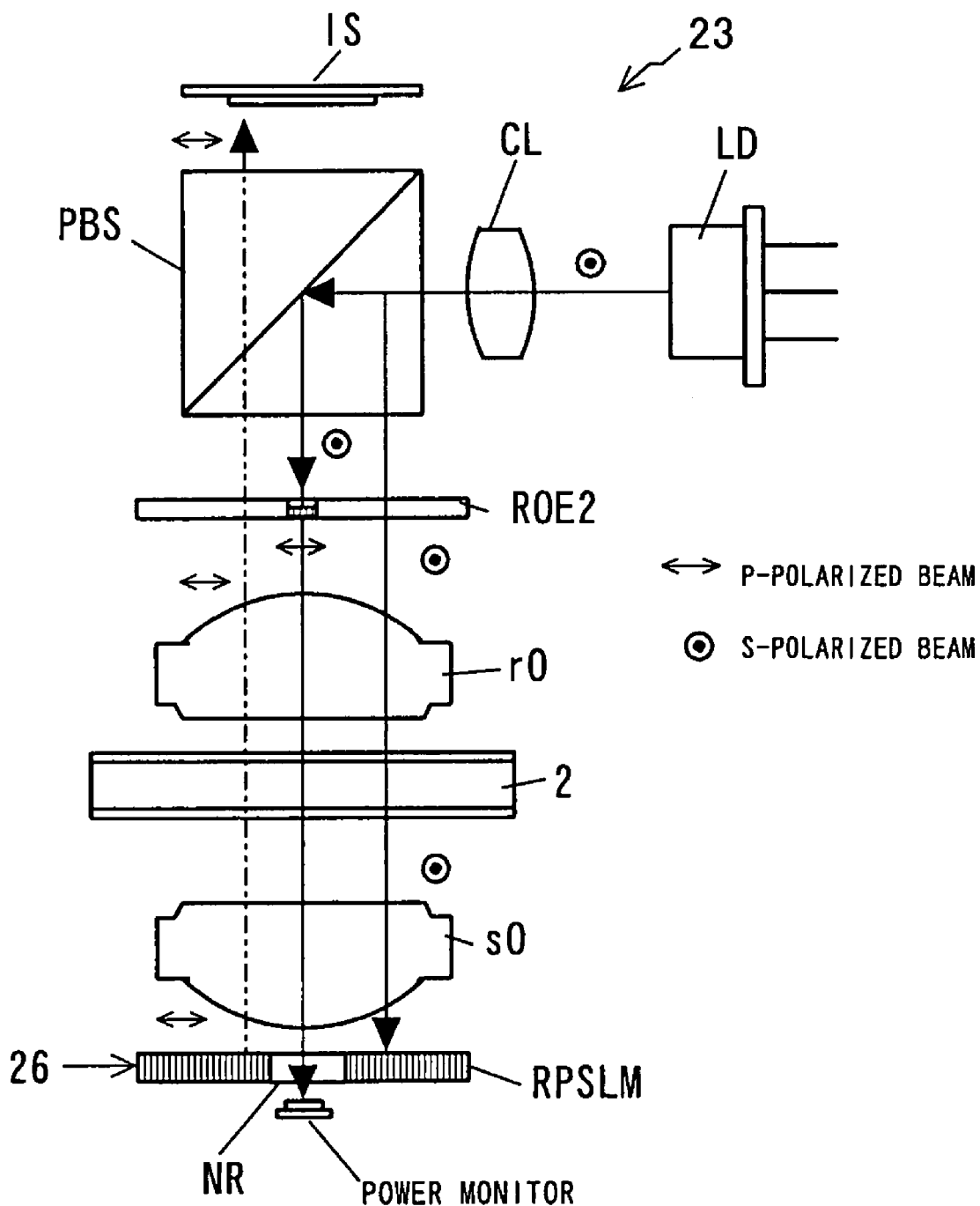

Meanwhile, in a recording operation, as shown in FIG. 20, the recording reference beam rRB, reflecting at the area around the non-reflective region NR of the reflective polarization spatial light modulator RPSLM, reflects as a signal beam while changing from S-polarization into P-polarization. The signal reference beam sRB, reflected upon a spatial light modulator SLM, diffracts in accordance with a spatial modulation pattern to record and becomes a polarization state same as the recording reference beam rRB, thus traveling as a signal beam toward the signal-beam objective lens sO while remaining as a collimated light beam. The P-polarized signal beam, thus modulated and reflected, is allowed to exit toward the hologram record carrier 2 through the signal-beam objective lens sO. When transmitting the hologram record carrier 2, interference occurs between the P-polarized signal beam and the P-polarized recording reference beam rRB, thereby recording a hologram.

The P-polarized signal beam (two-dot chain line in FIG. 20), reflected and passed through the hologram recording carrier, passes through the reference-beam objective lens rO, the second optical separator means ROE2 and the polarization beam splitter PBS, thus being focused on the image sensor IS. Here, imaging state is to be monitored.

Figure 21:
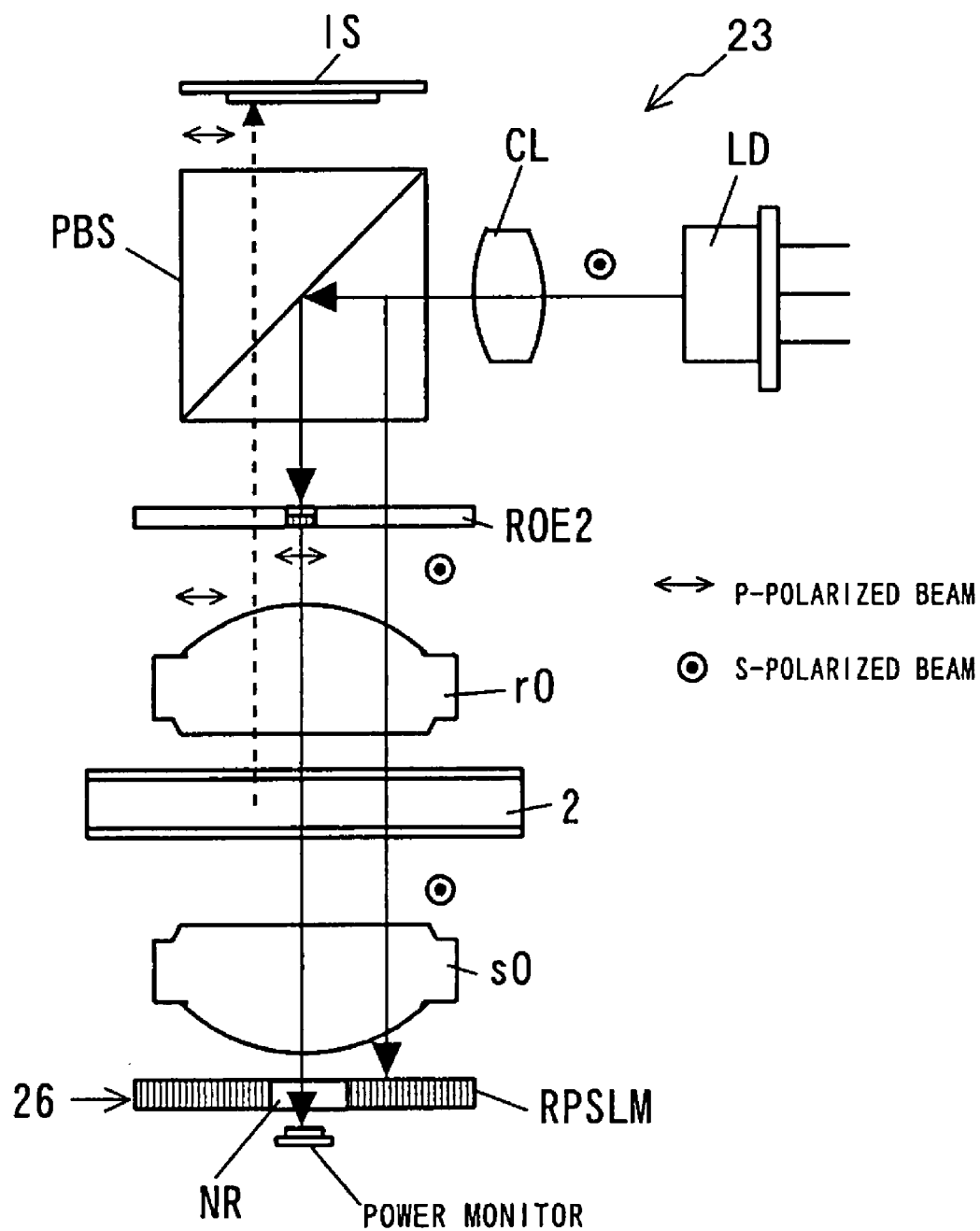

FIG. 21 shows a reproducing operation at the pickup.

Similarly to the recording operation, the S-polarized light beam, emitted from the laser light source LD, is irradiated to pass the hologram record carrier 2 through the collimator lens CL, the polarization beam splitter PBS, the second optical separator means ROE2 and the reference-beam objective lens rO. By the second optical separator means ROE2, produced is a P-polarized recording reference beam rRB nearby the optical axis of the light beam wherein an S-polarized light beam is provided in the periphery thereof.

When a P-polarized recording reference beam rRB passes through the diffraction grating of the hologram recording carrier 2, a reproduced beam is produced therefrom. The reproduced beam (broken line in FIG. 21) is focused on the image sensor IS through the reference-beam objective lens rO, the second optical separator means ROE2 and the polarization beam splitter PBS. The image sensor IS reproduces the signal recorded on the hologram.

As described above, the present embodiment is established with a recording reference beam rRB given as a nearly collimated light beam wherein the recording reference beam rRB is not to be reflected by the spatial optical modulator that a signal beam area and a recording beam area are spatially separated. Because the light beams, to interfere within the hologram record carrier 2, are suppressed to the minimal extent, there is no possibility to record a number of unwanted holograms.

In the present embodiment, the recording reference beam rRB is of a collimated beam. Because of satisfactorily simple alignment with the hologram record carrier 2, simplification is possible in accurate positioning, e.g., focus serve or tracking servo.

Because of the hologram to record is only one kind, it is possible to suppress the deterioration in reproducing S/N and the deterioration of the recording medium material to the minimal degree. Because of the capability of establishing a recording reference beam rRB not to reflect upon the spatial light modulator SLM without entering the signal-reproducing sensor, there is no need to provide the signal-reproducing sensor with a filter, etc. to separate a recording reference beam rRB.

Because the recording reference beam rRB is of a collimated beam, high accuracy is not required for the positional relationship between the pickup and the hologram record carrier 2, thus enabling reproducing without especially using servo control.

—Another Hologram Apparatus—

Figure 22:
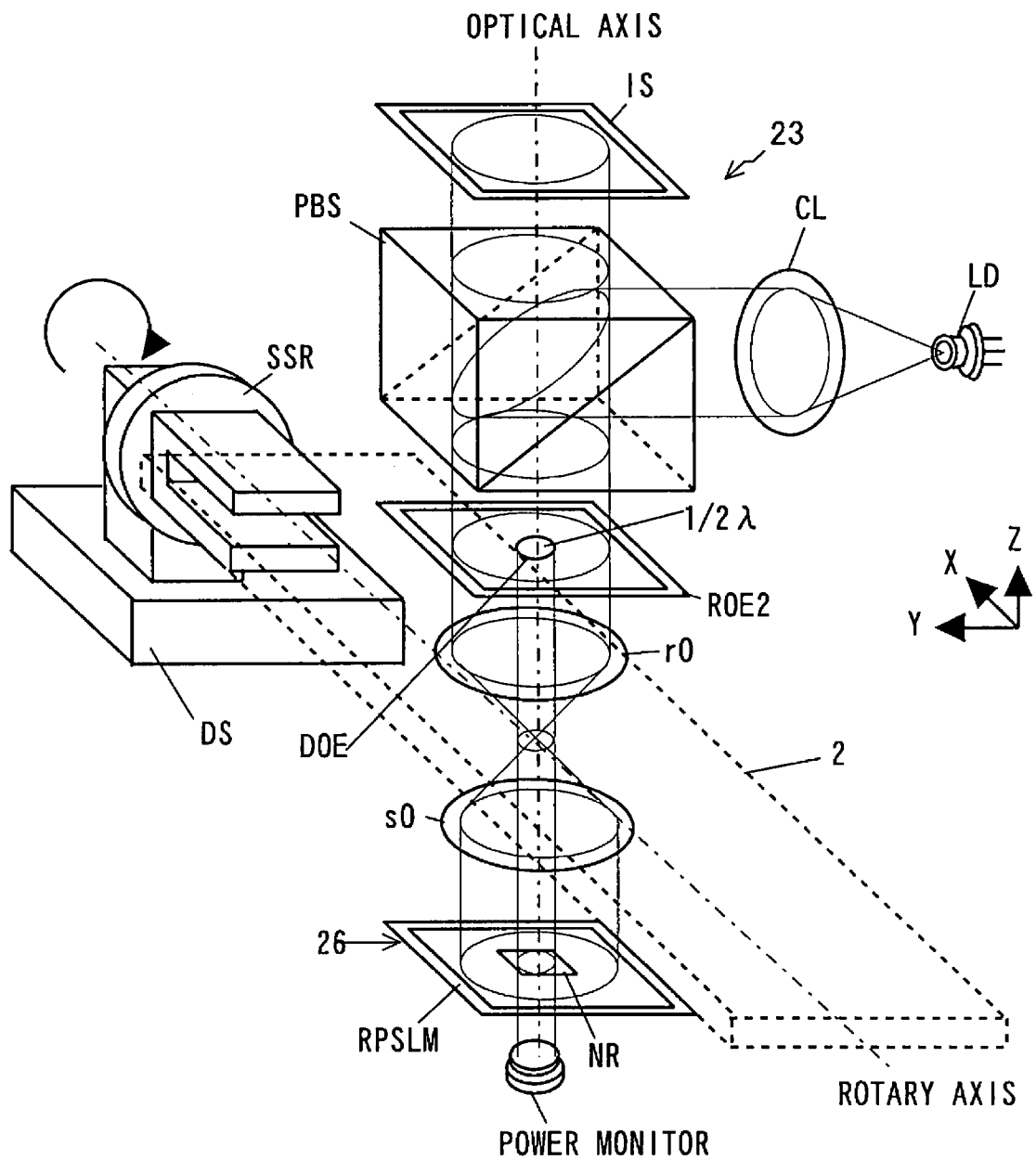
FIG. 22 is a schematic perspective view explaining a pickup of a hologram apparatus in another embodiment according to the invention.
Figure 2:
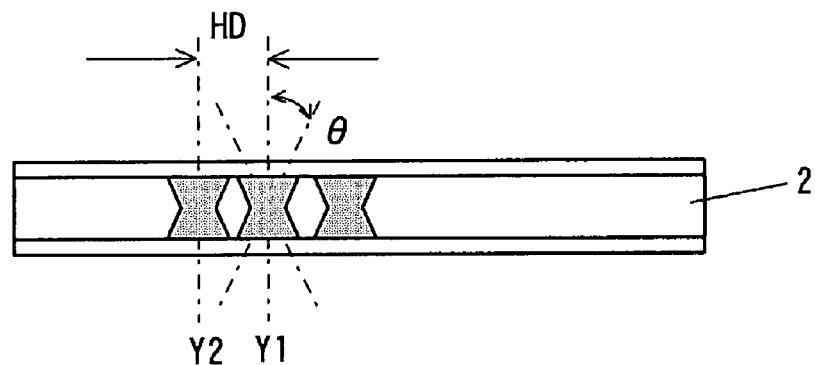
Figure 2:
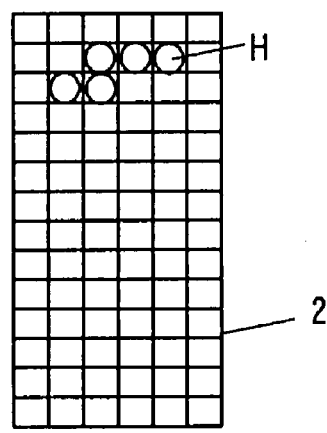
Figure 2:
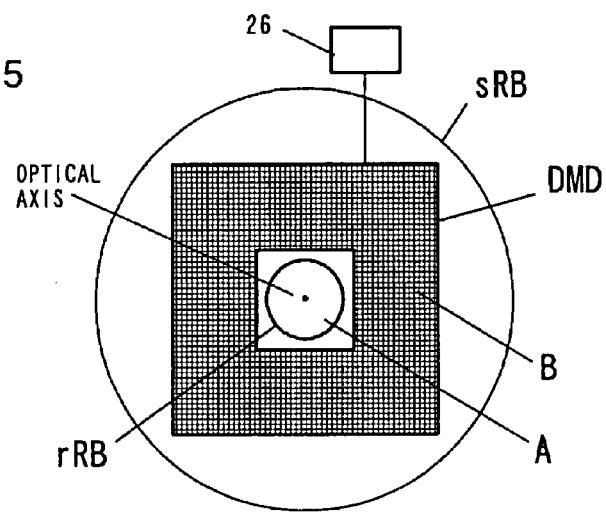

An outline view of another hologram recording and reproducing apparatus is shown in FIG. 22.

In the present embodiment, provided that the recording reference beam rRB is of a collimated beam (plane wave), shift-based multiplex recording cannot be performed for recording with an overlap by the horizontal movement of the hologram record carrier 2. Incidentally, shift-based multiplex recording is available if the recording reference beam rRB is provided at a small numerical aperture with the proper setting of a lens effective diameter and special light modulator non-reflective region for the same.

Accordingly, the multiplex recording hologram apparatus employs an angle-based multiplex scheme. As a result, the recording apparatus is structured with a pickup according to the second embodiment as shown in FIG. 22 wherein a hologram record carrier 2 is fit in and rotatably held by a rotary support SSR having a rotary axis vertical to the optical axis thereof. Furthermore, a drive stage DS is provided that is vertical to the optical axis of the pickup and for parallel-moving the support SSR in mutually-vertical XYZ directions. By means of the hologram recording and reproducing apparatus having the rotary support SSR and drive stage DS, the hologram record carrier 2 is rotated about the axis intersecting vertically with the pickup optical axis, to record a hologram with angular multiplexing. As shown in FIG. 23, after rotating the hologram record carrier 2 at a predetermined angle θ in its rotation angle, recording is terminated at the relevant region Y1, to move the hologram record carrier 2 to the next region Y2 (hologram group-to-group spacing HD).

In this case, the hologram group to record once in the angle-based multiplex recording scheme is taken as a record unit, to perform a recording in a manner not overlapped between hologram groups. FIG. 24 shows a format for separating between hologram groups by two-dimensionally arranging a plurality of angle-based multiplex regions where performed by angle-based multiplex recording. As shown in FIG. 24, hologram-group separation format is previously established in a grating form in the hologram record carrier 2. By allocating angle-based multiplex-recorded regions on a box-by-box basis, recording is made not to overlap the hologram H. If there is an overlap, the hologram in the one-preceding region is to be reproduced by a plane wave. For example, it can be considered to form on a protection layer a positioning mark for specifying a record position by moving the hologram record carrier 2 and a mark for hologram group separation. By repeating such record operation, recording can be completed over the entire surface of the hologram record carrier 2. The reference-beam objective lens rO and the signal-beam objective lens sO are required fixed in a state aligned with each other. Because the alignment with the hologram record carrier 2 is satisfactorily simple by virtue of the recording reference beam rRB given as a collimated beam, there is no need of accurate alignment, such as focus servo or tracking servo.

Meanwhile, in the case with a pickup exclusive for reproduction, the optical system of the signal-beam objective lens and the following is made unnecessary.

This embodiment uses an angle-based multiplex scheme as its multiplex scheme because the recording reference beam rRB is of a collimated beam (plane wave). Because the Mix angle of the recording reference beam rRB and signal beam can be taken great, the multiplexing angle can be reduced to increase the number of holograms to record at one location.

By providing a plurality of angle-based multiplexing region where multiplex recording can be terminate at one time, the potential of the hologram record carrier 2 can be used up.

—Still Another Hologram Apparatus—

Although the second embodiment was on the case the recording reference beam rRB and the signal reference beam sRB are in different state of polarization, the still other embodiment is on the case with a circular polarization state. Because of a circular polarization, a ¼-wavelength plate is arranged on an optical path of the both. Furthermore, this embodiment can use a lens, a diffractive optical element and the like in order to separate between a recording reference beam rRB and a signal reference beam sRB. The separation of reference and reproduced beams are made easy by the ¼-wavelength plate.

This embodiment uses a reflective spatial light modulator DMD such as so-called a DMD (digital micro-mirror device) (registered trademark) in place of the reflective polarization spatial light modulator RPSLM. The reflective spatial light modulator DMD is demarcated with a central region A of the foregoing non-reflective region NR including the optical axis at around the optical axis and a spatial light modulating region B surrounding it and not including the optical axis, as shown in FIG. 25. At least the spatial light modulating region B has a plurality of microscopic mirrors, say, in a matrix form laid countlessly, say, on a silicon substrate, which is a portion to partially divide and reflect a beam by those mirrors. The central region A is structured not to return a recording or reproducing reference beam by a through-opening, a light absorbing area or controlling a beam to reflect toward a direction different from the spatial light modulator B.

The reflective spatial light modulator DMD is connected to the drive circuit 26 so that it can modulate the polarization direction of a beam to have a distribution base on the page data, to record, provided therefrom, thereby generating a signal light including a beam having a predetermined polarization direction (direction to regularly reflect toward a direction whose incident angle is zero degree).

Where using a reflective spatial light modulator DMD, a ¼-wavelength plate is arranged on an optical path in order to separate a reflected light beam because the reflecting light beam cannot be adjusted as to the polarization-directional component.

Figure 26:
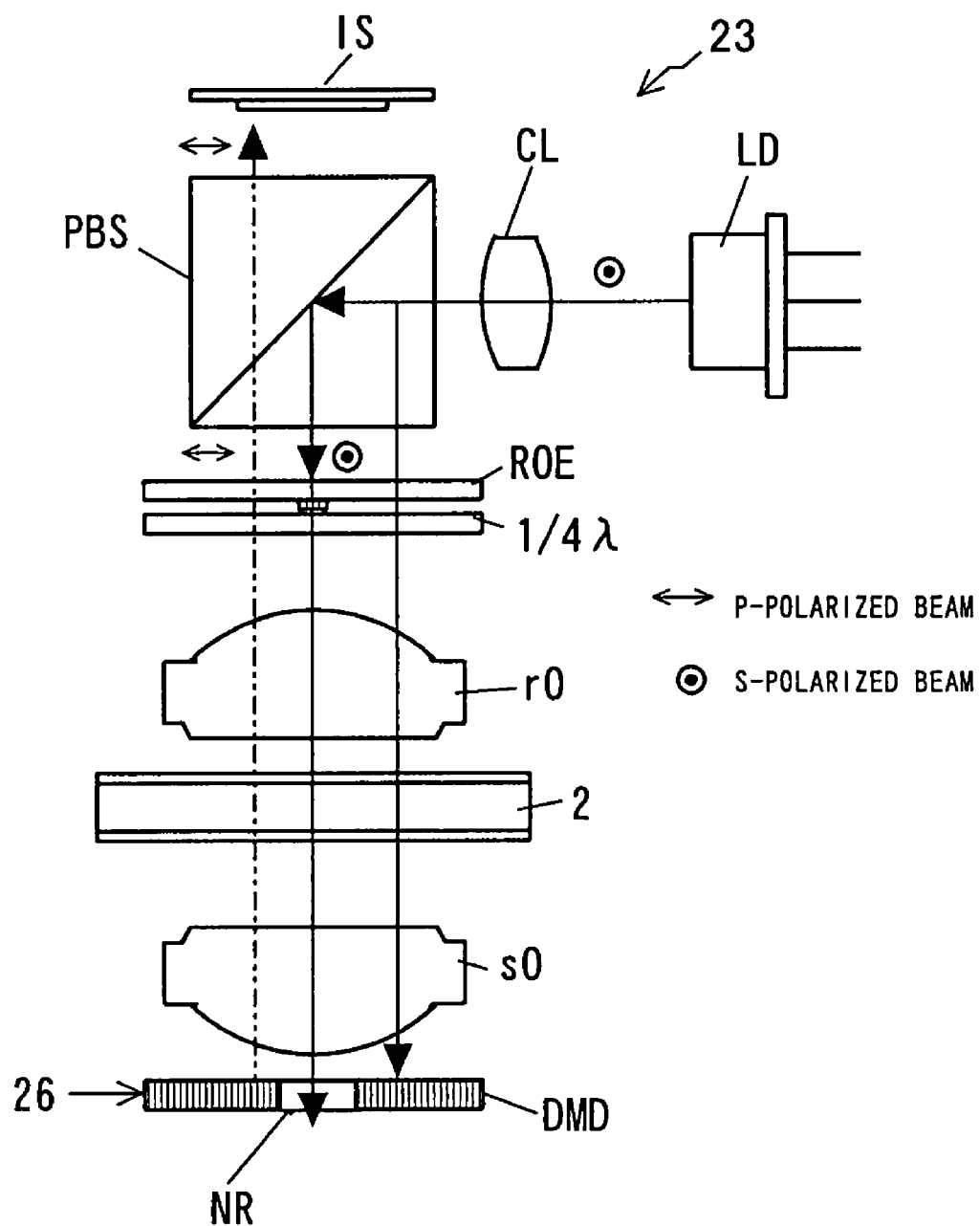
FIGS. 26 and 27 are schematic structural view explaining a pickup of a hologram apparatus in another embodiment according to the invention.
Figure 27:
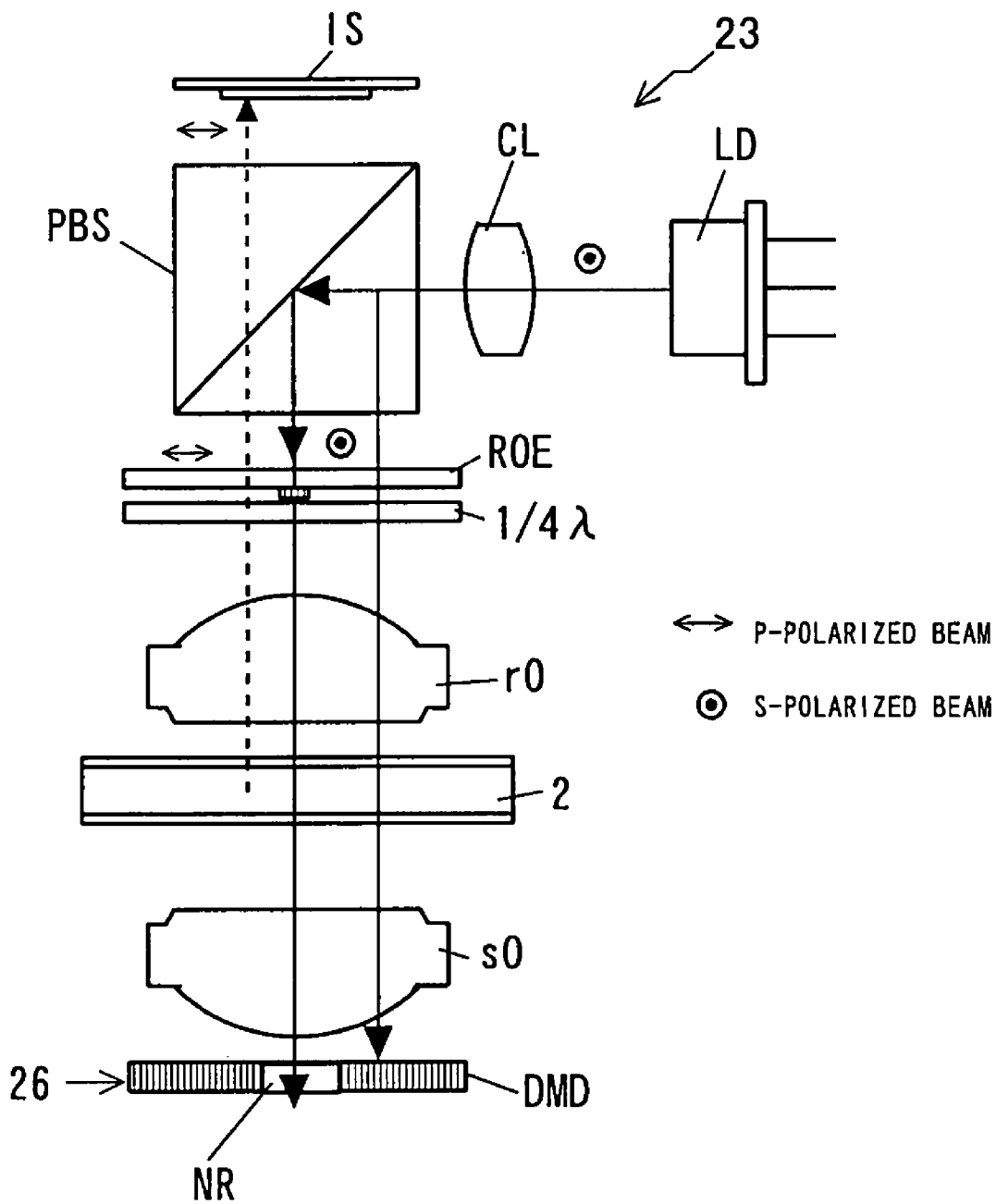

An outline view of still another hologram recording and reproducing unit is shown in FIGS. 26 to 27.

In recording operation, as shown in FIG. 26, the S-polarized diverging coherent beam, emitted from a laser light source LD, is made into a collimated beam by a collimator lens CL and reflected by a polarization beam splitter PBS, to enter a reference-beam objective lens rO through optical separator means ROE and a ¼-wavelength plate ¼λ.

Combined with the optical action of the diffraction grating at the optical separator means ROE, the reference-beam objective lens rO allows the light beam portion nearby the optical axis to exit as a P-polarized collimated beam of recording reference beam rRB and simultaneously the peripheral light beam (recording reference beam rRB) to exit as a circularly-polarized converging light beam.

The circularly-polarized signal reference beam sRB and the P-polarized recording reference beam rRB are focused by the reference-beam objective lens rO on the hologram record carrier 2, thus being placed in interference.

The both light beams, transmitted through the hologram record carrier 2, enter the signal-beam objective lens sO where the recording reference beam rRB entering nearby the optical axis is focused while the signal reference beam sRB at the periphery thereof is changed into a collimated beam.

The converging recording reference beam rRB is, say, allowed to transmit through the non-reflective region NR on the optical axis of the reflective spatial light modulator DMD while the signal reference beam sRB is reflected by the area around the non-reflective region NR. Because the recording reference beam rRB does not return toward the signal-beam objective lens sO because of not being reflected.

The signal reference beam sRB, reflected upon the reflective spatial light modulator DMD, is diffracted by the spatial modulation pattern to record, to travel toward the signal-beam objective lens sO while remaining as a collimated light beam. The signal beam, thus modulated and reflected, exits toward the hologram record carrier 2 through the signal-beam objective lens sO. When transmitting the hologram recording carrier 2, interference is effected with the incident recording reference beam rRB, thus being hologram-recorded.

The circularly-polarized signal beam (two-dot chain line in FIG. 26), reflected and passed the hologram record carrier, turns into P-polarized beam through the reference-beam objective lens rO and the ¼-wavelength plate ¼λ and focused on the image sensor IS through the optical separator means ROE and the polarization beam splitter PBS. Here, imaging state is to be monitored.

FIG. 27 shows a reproducing operation at the pickup.

Similarly to the recording operation, the S-polarized light beam emitted from the laser light source LD is irradiated in a manner to pass the hologram record carrier 2 through the collimator lens CL, the polarization beam splitter PBS, the optical separator means ROE, the ¼-wavelength plate ¼λ and the reference-beam objective lens rO. By means of the optical separator means ROE, produced is a reproducing reference beam rRB that is nearby the optical axis of the light beam.

When the reproducing reference beam rRB, made in a circularly polarized beam by the ¼-wavelength plate ¼λ, passes the diffraction grating of the hologram record carrier 2, a reproduced beam is produced therefrom. The reproduced beam (broken line in FIG. 27) turns into a P-polarized beam through the reference-beam objective lens rO and the ¼-wavelength plate ¼λ, thus being focused on the image sensor IS through the optical separator means ROE and the polarization beam splitter PBS. By the image sensor IS, reproduced is the signal recorded on a hologram.

As described above, the present embodiment is also established with a recording reference beam rRB given as a nearly collimated light beam wherein the recording reference beam rRB is not to be reflected by the spatial optical modulator that a signal beam area and a recording beam area are spatially separated, thus suppressing the interfering light beam to a certain degree in the hologram record carrier 2.

The invention claimed is:

1. A method of recording a hologram, on a hologram recording apparatus having a pair of optical systems oppositely arranged spaced both on an optical axis sandwiching a hologram record carrier, the one pair of optical systems being made up by a reference-beam optical system having a reference-beam objective lens through which a reference beam is to be exited toward the hologram record carrier and a signal-beam optical system having a signal-beam objective lens through which a signal beam is to be exited toward the hologram record carrier, the signal-beam optical system including a spatial light modulator that produces the signal beam by modulation from the reference beam transmitted through the hologram record carrier according to record information, to record information by forming a diffraction grating through oppositely irradiating the signal beam and the reference beam to the hologram record carrier, the method comprising:

a step of focusing the reference beam at a first numerical aperture from a first effective diameter by means of the reference-beam objective lens;

a step of separating the reference beam in a part on the optical axis and a neighborhood thereof to thereby produce from the reference beam a recording reference beam to passes through the hologram record carrier at a second numerical aperture smaller than the first numerical aperture from a second effective diameter smaller than the first effective diameter by means of the reference-beam objective lens of the reference-beam optical system, and allowing the recording reference beam to exit coaxially to the reference beam; and a step of not allowing only the recording reference beam to exit toward the hologram record carrier by means of the signal-beam optical system.

2. A method according to claim 1, wherein the second numerical aperture includes zero.

3. A method according to claim 1, wherein the spatial light modulator of the signal-beam optical system is a reflective spatial light modulator formed by a central region arranged on the optical axis and for deflecting, transmitting or absorbing the recording reference beam and a spatial light modulating region arranged around the central region and for reflecting the reference beam and producing the signal beam.

4. A method according to claim 1, including a step of modulating the reference beam at the signal-beam optical system to thereby change a polarization state thereof same as a polarization state of the recording reference beam and producing the signal beam.

5. A method according to claim 4, wherein the spatial light modulator is a reflective polarization spatial light modulator formed by a central region arranged on the optical axis and for transmitting or absorbing the recording reference beam and a spatial light modulating region arranged around the central region and for modulating the reference beam and producing the signal beam, a ½ wavelength plate being arranged on the optical axis in the reference-beam optical system which makes the recording reference beam and the reference beam different in polarization state from each other.

6. A method according to claim 5, wherein the central region is formed by a through-opening, of a transparent material or a light-absorbing material, the spatial light modulating region being made up by a reflective matrix liquid-crystal device.

7. A method according to claim 4, wherein the spatial light modulator is formed by a transmissive spatial light modulator and a polarization-selective reflection film that are arranged in an order closer to the signal-beam objective lens and parallel with each other, the transmissive spatial light modulator being formed by a central region arranged on the optical axis and for passing or absorbing the recording reference beam and a spatial light modulating region made up by a matrix liquid-crystal device arranged around the central region and for modulating the reference beam and producing the signal beam.

8. A method according to claim 7, wherein the central region is formed by a through-opening, of a transparent material or a light-absorbing material.

9. A method according to claim 7, wherein the central region and the spatial light modulating region are formed by a transmissive matrix liquid-crystal device, the central region being in a light-transmissive state when irradiating the recording reference beam.

10. A method according to claim 1, wherein the hologram record carrier is arranged between a common focal point of the reference-beam objective lens and signal-beam objective lens and the reference-beam objective lens or signal-beam objective lens.

11. A method according to claim 10, wherein the hologram record carrier is arranged on a side closer to a greater one in focal length of the reference-beam objective lens and the signal-beam objective lens.

12. A method of reproducing a hologram, that reproduces information from a hologram record carrier recording information in accordance with a hologram recording method according to claim 1, the method comprising:

a step of collecting the recording reference beam toward the hologram record carrier arranged between the reference-beam optical system and the signal-beam optical system, by means of the reference-beam objective lens; and a step of collecting and guiding, to a photo-detector, a reproduced beam from the diffraction grating of the hologram record carrier through which the recording reference beam transmits, by means of the reference-beam objective lens.

13. An apparatus of recording a hologram, having a support that removably supports a hologram record carrier for storing an optical interference pattern as a diffraction grating therein, and an optical system pair made up by a reference-beam optical system for exiting a reference beam toward the hologram record carrier and a signal-beam optical system including a spatial light modulator that receives the reference beam and producing a signal beam modulated from the reference beam according to record information and for exiting the signal beam, that are oppositely arranged spaced on an optical axis sandwiching the hologram record carrier, thereby forming a diffraction grating through oppositely irradiating the signal beam and the reference beam to the hologram record carrier, the apparatus comprising:

the reference-beam optical system having a reference-beam objective lens that collects the reference beam at a first numerical aperture and optical separator means that is arranged coaxially to the reference-beam objective lens and has a function to separate the reference beam in a part on the optical axis and a neighborhood thereof and produce a recording reference beam to pass the hologram record carrier at a second numerical aperture smaller than the first numerical aperture from the reference-beam objective lens;

the signal-beam optical system having a signal-beam objective lens having the first numerical aperture and arranged coaxially to the reference-beam objective lens in a manner having a focal point coincident with a focal point of the reference-beam objective lens, the spatial light modulator having a non-reflective region that modulates the reference beam passed the signal-beam objective lens to thereby produce the signal beam without reflecting the recording reference beam.

14. An apparatus according to claim 13, wherein the second numerical aperture includes zero.

15. An apparatus according to claim 13, wherein the optical separator means is formed with a parallel plate region integrally formed in a central portion of the reference-beam objective lens.

16. An apparatus according to claim 13, wherein the optical separator means is made up by a diffractive optical element arranged, on the optical axis, opposite to the hologram record carrier with respect to the reference-beam objective lens and having a concave lens function.

17. An apparatus according to claim 13, wherein the optical separator means is made up by a diffractive optical element formed, on the optical axis, integrally in a central portion of the reference-beam objective lens and having a concave lens function.

18. An apparatus according to claim 13, wherein provided, on the optical axis, is a parallel plate region formed integral in a central portion of the signal-beam objective lens.

19. An apparatus according to claim 13, wherein the non-reflective region the recording reference beam is not to be reflected is formed by a mirror surface to deflect the recording reference beam.

20. An apparatus according to claim 13, wherein the non-reflective region the recording reference beam is not to be reflected is formed by a through-opening or of a transparent material that transmits the recording reference beam.

21. An apparatus according to claim 13, wherein the non-reflective region the recording reference beam is not to be reflected is formed of an absorbing material that absorbs the recording reference beam.

22. An apparatus according to claim 13, wherein the non-reflective region the recording reference beam is not to be reflected is a part of the spatial light modulator that is in a light-transmissive state during recording.

23. An apparatus according to claim 13, wherein the spatial light modulator is a reflective spatial light modulator.

24. An apparatus according to claim 13, wherein the spatial light modulator is a reflective spatial light modulator, a ½ wavelength plate being arranged on the optical axis which makes the recording reference beam and the reference beam different in polarization state from each other.

25. An apparatus according to claim 13, wherein the spatial light modulator is formed by a transmissive spatial light modulator and a polarization-selective reflection film that are arranged in an order closer to the signal-beam objective lens and parallel with each other.

26. An apparatus of reproducing a hologram, including a photo-detector arranged in the reference-beam optical system and for detecting a reproduced beam produced from the hologram record carrier through irradiating the recording reference beam and optical means for guiding the reproduced beam from the reference-beam objective lens to the photo-detector, in addition to the hologram recording apparatus according to claim 13.

27. An optical pickup device, that records or reproduces information to or from a hologram record carrier for storing therein, as diffractive grating, an optical interference pattern based on a reference beam and a signal beam the reference beam is modulated according to record information, the device comprising:
a light source that generates a coherent reference beam;
an optical system pair oppositely arranged spaced on an optical axis sandwiching the hologram record carrier and made up by a reference-beam optical system that exits the reference beam toward the hologram record carrier and a signal-beam optical system that receives the reference beam and exits a signal beam;
a reference-beam objective lens arranged in the reference-beam optical system and for collecting the reference beam at a first numerical aperture;
optical separator means arranged coaxially to the reference-beam objective lens in the reference-beam optical system and for separating the reference beam in a part on the optical axis and a neighborhood thereof and producing a recording reference beam to pass the hologram record carrier at a second numerical aperture different from the first numerical aperture from the reference-beam objective lens;
a signal-beam objective lens arranged in the signal-beam optical system and arranged having the first numerical aperture and coaxially to the reference-beam objective lens in a manner having a focal point coincident with a focal point of the reference-beam objective lens;
a spatial light modulator arranged in the signal-beam optical system and having a non-reflective region that modulates the reference beam passed the signal-beam objective lens to thereby produce the signal beam without reflecting the recording reference beam; and
a photo-detector for detecting a reproduced beam produced from the hologram record carrier through irradiating the recording reference beam and optical means for guiding the reproduced beam from the reference-beam objective lens to the photo-detector, that are arranged in the reference-beam optical system.

28. A device according to claim 27, wherein the second numerical aperture is smaller than the first numerical aperture.

29. A device according to claim 27, wherein the second numerical aperture includes zero.

30. A device according to claim 29, wherein the optical separator means is formed with a parallel plate region integrally formed in a central portion of the reference-beam objective lens.

31. A device according to claim 27, wherein the optical separator means is made up by a diffractive optical element arranged, on the optical axis, opposite to the hologram record carrier with respect to the reference-beam objective lens and having a concave lens function.

32. A device according to claim 27, wherein the optical separator means is made up by a diffractive optical element formed, on the optical axis, integrally in a central portion of the reference-beam objective lens and having a concave lens function.

33. A device according to claim 27, wherein provided, on the optical axis, is a parallel plate region formed integral in a central portion of the signal-beam objective lens.

34. A device according to claim 27, wherein the non-reflective region the recording reference beam is not to be reflected is formed by a mirror surface to deflect the recording reference beam.

35. A device according to claim 27, wherein the non-reflective region the recording reference beam is not to be reflected is formed by a through-opening or of a transparent material that transmits the recording reference beam.

36. A device according to claim 27, wherein the non-reflective region the recording reference beam is not to be reflected is formed by an absorbing material that absorbs the recording reference beam.

37. A device according to claim 27, wherein the non-reflective region the recording reference beam is not to be reflected is a part of the spatial light modulator that is in a light-transmissive state during recording.

38. A device according to claim 27, wherein the spatial light modulator is a reflective spatial light modulator.

39. A device according to claim 27, wherein the spatial light modulator is a reflective spatial light modulator, a ½ wavelength plate being arranged on the optical axis which makes the recording reference beam and the reference beam different in polarization state from each other.

40. A device according to claim 27, wherein the spatial light modulator is formed by a transmissive spatial light modulator and a polarization-selective reflection film that are arranged in an order closer to the signal-beam objective lens and parallel with each other.

* * * * *